United States Patent
Milano et al.

(10) Patent No.: US 10,153,560 B2
(45) Date of Patent: Dec. 11, 2018

(54) ANTENNA MODULES AND SYSTEMS, AND APPLICATIONS AND METHODS OF MANUFACTURING THEREOF

(71) Applicant: BEAM SEMICONDUCTOR LTD., Toronto (CA)

(72) Inventors: Alberto Milano; Rafi Popovich, Rehovot (IL); Abraham Saad, Rehovot (IL); Jacob Reshef, Rehovot (IL)

(73) Assignee: BEAM SEMICONDUCTOR LTD., Toronto (CA)

( * ) Notice: Subject to any disclaimer, the term of this patent is extended or adjusted under 35 U.S.C. 154(b) by 0 days.

(21) Appl. No.: 15/836,205

(22) Filed: Dec. 8, 2017

(65) Prior Publication Data

US 2018/0109005 A1    Apr. 19, 2018

Related U.S. Application Data

(63) Continuation of application No. PCT/CA2016/051016, filed on Aug. 29, 2016.

(51) Int. Cl.
*H04N 5/38* (2006.01)
*H01Q 21/06* (2006.01)
(Continued)

(52) U.S. Cl.
CPC ......... *H01Q 21/065* (2013.01); *H01Q 19/062* (2013.01); *H01Q 21/0037* (2013.01);
(Continued)

(58) Field of Classification Search
CPC .... H01Q 21/00; H01Q 21/065; H01Q 21/061; H01Q 21/24; H01Q 21/245;
(Continued)

(56) References Cited

U.S. PATENT DOCUMENTS 4,028,702 A * 6/1977 Levine ................ H01Q 3/2676
342/374
4,725,844 A * 2/1988 Goodwin ............ H01Q 3/2676
342/374
(Continued)

FOREIGN PATENT DOCUMENTS

WO    2018039766 A1    3/2018

OTHER PUBLICATIONS

Document relating to International Application No. PCT/CA2016/051016, dated, May 3, 2017 (International Search Report).
(Continued)

*Primary Examiner* — Trang U Tran
(74) *Attorney, Agent, or Firm* — Bereskin & Parr LLP/S.E.N.C.R.L., s.r.l.

(57) ABSTRACT

Antenna modules and systems, and applications and methods of manufacturing thereof, are described herein. An example radio frequency (RF) signal transmitter includes a data signal port to receive a baseband data signal; a carrier signal port to receive an initial carrier signal; and an antenna module coupled to the signal ports. The antenna module includes: a substrate with a front face that has a phased array of active antenna elements that includes at least two columns of the active antenna elements; and a rear face that has, for each column, a RF signal launcher to receive a RF data signal for the column; and a transmitting module mounted to the rear face. The transmitting module has, for each column of active antenna elements: a combiner to form the RF data signal; and a RF signal port to transmit the RF data signal to the RF signal launcher.

23 Claims, 18 Drawing Sheets

(51) Int. Cl.
*H01Q 21/00* (2006.01)
*H01Q 21/24* (2006.01)
*H03B 19/10* (2006.01)
*H01Q 19/06* (2006.01)
*H01Q 1/42* (2006.01)
*H01Q 1/52* (2006.01)
*H01Q 3/36* (2006.01)

(52) U.S. Cl.
CPC ....... *H01Q 21/0075* (2013.01); *H01Q 21/061* (2013.01); *H01Q 21/245* (2013.01); *H03B 19/10* (2013.01); *H01Q 1/42* (2013.01); *H01Q 1/523* (2013.01); *H01Q 3/36* (2013.01)

(58) Field of Classification Search
CPC ........... H01Q 21/0037; H01Q 21/0075; H01Q 21/965; H01Q 1/42; H01Q 1/523; H01Q 3/36
USPC ..... 455/334, 127.4; 348/723, 725, 21, 385.1
See application file for complete search history.

(56) References Cited

U.S. PATENT DOCUMENTS

| | | | | |
|---|---|---|---|---|
| 5,731,790 | A * | 3/1998 | Riza | H01Q 3/2676 342/368 |
| 5,751,242 | A * | 5/1998 | Goutzoulis | G01S 7/032 342/157 |
| 7,006,040 | B2 * | 2/2006 | Henderson | H01Q 1/007 342/372 |
| 7,043,271 | B1 * | 5/2006 | Seto | H01Q 3/2605 398/58 |
| 7,136,113 | B2 * | 11/2006 | Lee | H01Q 1/247 348/725 |
| 7,675,465 | B2 | 3/2010 | Doan et al. | |
| 7,852,265 | B2 | 12/2010 | Milano et al. | |
| 7,898,464 | B1 * | 3/2011 | Anderson | H01Q 3/2676 342/175 |
| 8,183,935 | B2 | 5/2012 | Milano et al. | |
| 8,854,277 | B2 | 10/2014 | De Graauw et al. | |
| 9,118,107 | B2 | 8/2015 | Rofougaran | |
| 9,595,757 | B2 * | 3/2017 | Saint Clair | H01Q 3/2676 |
| 9,634,389 | B2 * | 4/2017 | Tseng | H01Q 3/36 |
| 2006/0084406 | A1 * | 4/2006 | Strachan | H04L 27/18 455/334 |
| 2012/0235881 | A1 | 9/2012 | Pan et al. | |
| 2014/0009364 | A1 | 1/2014 | Yehezkely | |
| 2014/0266902 | A1 | 9/2014 | Kamgaing et al. | |
| 2017/0117754 | A1 | 4/2017 | Noori et al. | |
| 2017/0302306 | A1 | 10/2017 | Duyang et al. | |
| 2017/0309991 | A1 | 10/2017 | Noori et al. | |
| 2018/0026341 | A1 | 1/2018 | Mow et al. | |

OTHER PUBLICATIONS

Document relating to International Application No. PCT/CA2016/051016, dated, May 3, 2017 (Written Opinion).
P. Uhlig, J. Balcells, "IMST GmbH—Producibility and Re-Design of LTCC Antenna Modules", Nov. 2013.
Computer Simulation Technology: "A Dielectric Lens Antenna with Enhanced Aperture Efficiency for Industrial Radar Applications", 2016. Available online: https://www.cst.com/solutions/article/a-dielectric-ens-antenna-with-enhanced-aperture-efficiency-for-industrial-radar-applications.
B. Sanadgol, S. Holzwarth, A. Milano and R. Popovich, "60 GHz substrate integrated waveguide fed steerable LTCC antenna array," Proceedings of the Fourth European Conference on Antennas and Propagation, Barcelona, Spain, 2010, pp. 1-4. keywords, Available online: http://ieeexplore.ieee.org/stamp/stamp.jsp?tp=&arnumber=5504945&isnumber=5504894.
B. Sanadgol, S. Holzwarth, A. Milano, R. Popovich: "60 GHz Substrate Integrated Waveguide Fed Steerable LTCC Antenna Array", 4th European Conference on Antennas and Propagation, EuCAP Presentation, Barcelona, Spain, Apr. 12-16, 2010.
Uhlig, P., Holzwarth, S., Sanadgol, B., & Serwa, A., "Three-Dimensional Surface in LTCC for a MM-Wave Antenna." International Symposium on Microelectronics, 2011(1), 000527-000533. Available online: https://doi.org/10.4071/isom-2011-WA3-Paper1.
B. Sanadgol, S. Holzwarth, Uhlig, P., A. Milano and R. Popovich, "60 GHz SIW Steerable Antenna Array in LTCC" ZTE communications 2012; 10 (4) : 29-32, Available online: http://wwwen.zte.com.cn/endata/magazine/ztecommunicalions/2012/4/artides/201301/t20130106_380447.html.
B. Sanadgol, S. Holzwarth, Uhlig, P., A. Milano and R. Popovich, "60 GHz SIW Steerable Antenna Array in LTCC." IMST GmbH, Beam Network, 2012.

* cited by examiner

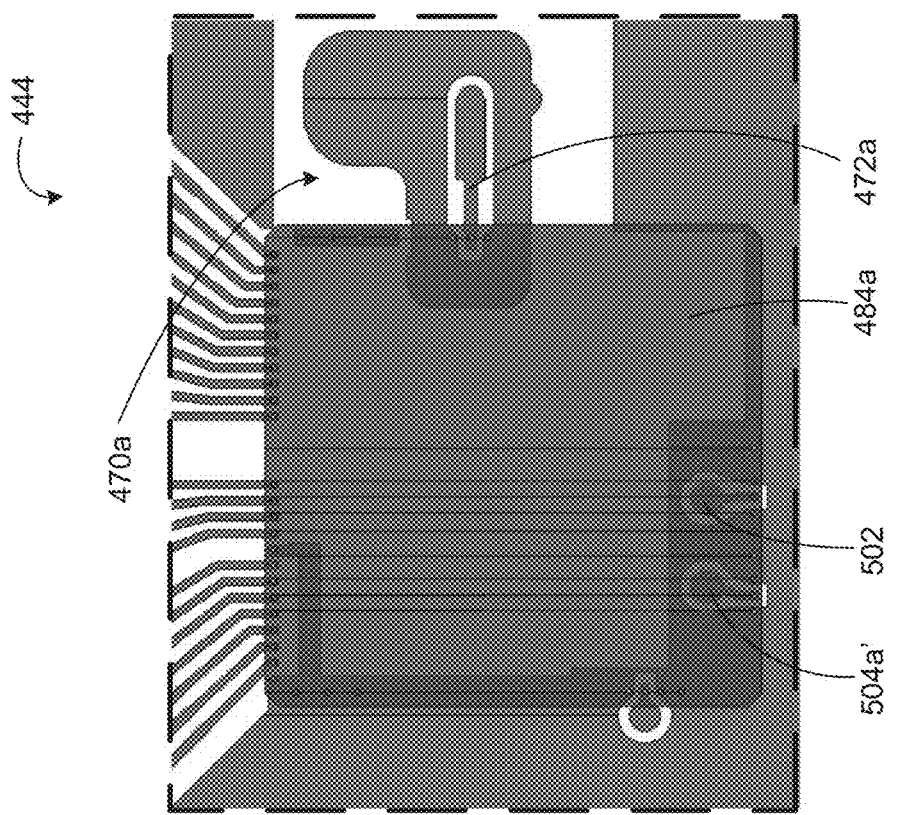
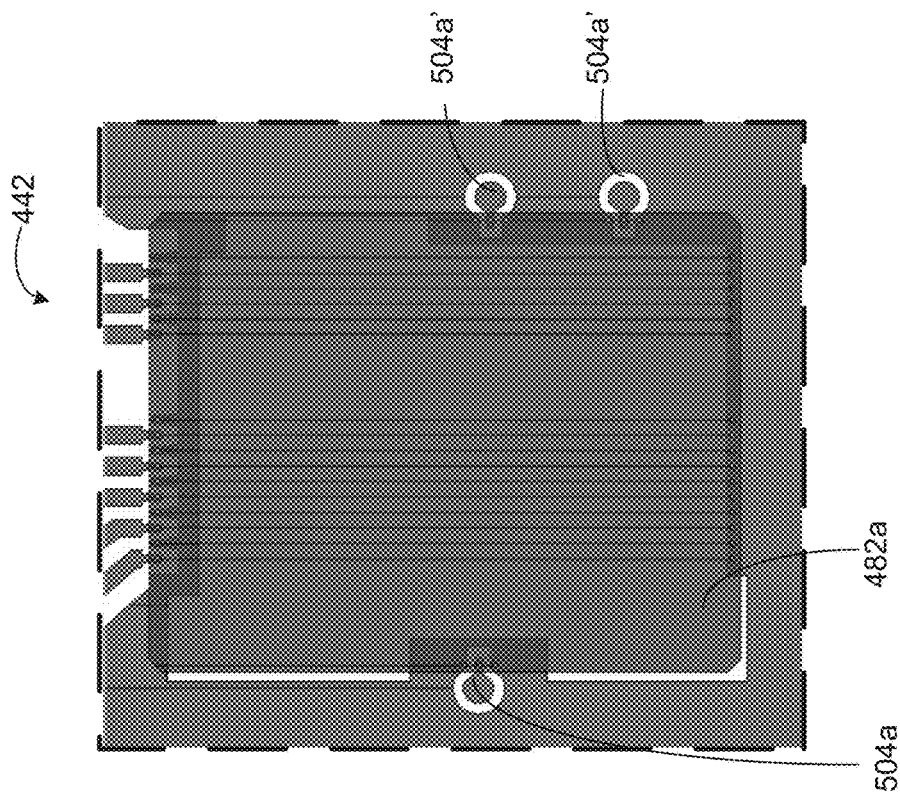
FIG. 13b
FIG. 13a

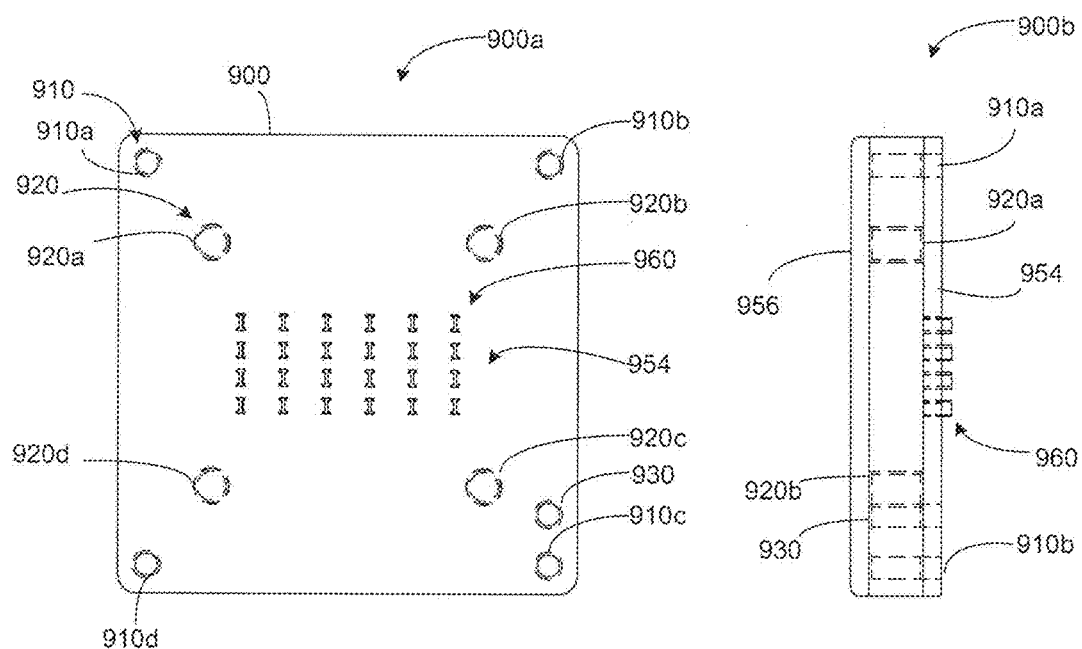
FIG. 18a
FIG. 18b
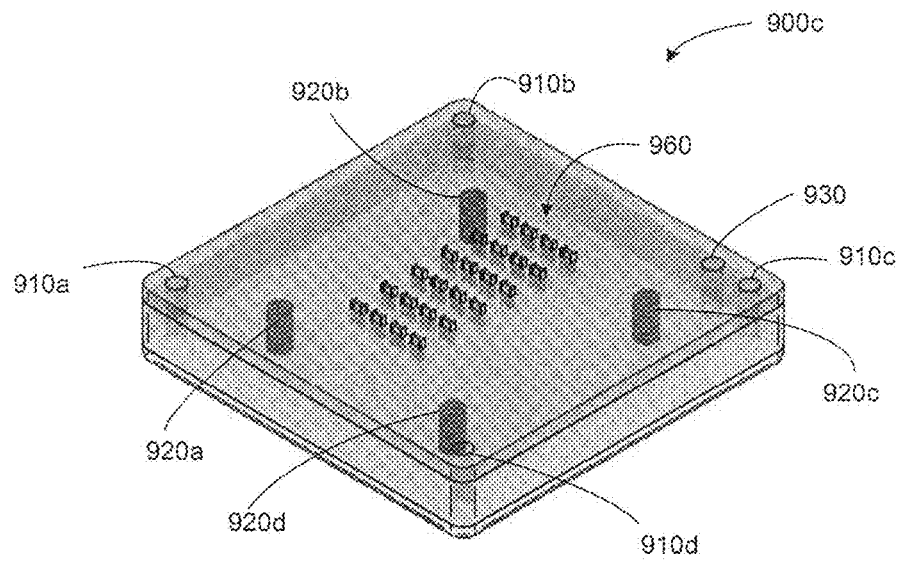
FIG. 18c

ANTENNA MODULES AND SYSTEMS, AND APPLICATIONS AND METHODS OF MANUFACTURING THEREOF

CROSS-REFERENCE TO RELATED PATENT APPLICATION

This application is a continuation of PCT Application No. PCT/CA2016/051016 filed on Aug. 29, 2016. The complete disclosure of PCT Application No. PCT/CA2016/051016 is incorporated herein by reference.

FIELD

The described embodiments relate to various implementations of antenna modules and systems, and applications and methods of manufacturing thereof.

BACKGROUND

Antenna systems that operate at high frequencies can benefit from various characteristics associated with high frequency data transmissions. For example, both antenna gain and directivity vary proportionally with frequency. Operation within the Extremely High Frequency (EHF) band (e.g., the range from 30 to 300 GHz), or the millimeter-wave band, can result in physically smaller antennas that can obtain a similar degree of directivity and gain than antennas operating within lower frequency bands.

The unlicensed 60 GHz band is commonly used for high-capacity data transmission. The 60 GHz band is located within the millimeter-wave section of the electromagnetic spectrum and ranges from 57 to 64 GHz. Recently, the United States' Federal Communications Commission (FCC) approved the expansion of the 60 GHz band to include the frequency range of up to 71 GHz.

SUMMARY

The various embodiments described herein generally relate to antenna modules and systems, and applications and methods of manufacturing thereof.

In accordance with an embodiment, there is provided a radio frequency signal transmitter having: a data signal port for receiving a baseband data signal; a carrier signal port for receiving an initial carrier signal; and an antenna module coupled to each of the data signal port and the carrier signal port, the antenna module having: a substrate having: a front face having a phased array of active antenna elements, the phased array of active antenna elements including at least two columns of the active antenna elements; and a rear face opposite the front face, the rear face having, for each column of active antenna elements, a radio frequency (RF) signal launcher to receive a RF data signal for the column of active antenna elements; and a transmitting module mounted to the rear face of the substrate, the transmitting module having, for each column of active antenna elements: a combiner to combine the baseband data signal and a version of the initial carrier signal to form the RF data signal; and a RF signal port to transmit the RF data signal to the RF signal launcher.

In some embodiments, a number of active antenna elements in each column is a power of two.

In some embodiments, each column comprises a pair of passive antenna elements positioned at opposite ends of the column.

In some embodiments, each column is positioned substantially equidistant from a neighboring column.

In some embodiments, each column comprises at least four active antenna elements.

In some embodiments, the transmitting module includes: a frequency multiplier to receive the initial carrier signal from the carrier signal port and to convert the initial carrier signal to a second version of the initial carrier signal, wherein a frequency of the second version of the initial carrier signal is equal to a frequency of the initial carrier signal multiplied by a first multiplication factor; and the combiner forms the RF data signal using the baseband data signal and the second version of the initial carrier signal.

In some embodiments, the frequency multiplier converts the second version of the initial carrier signal to a third version of the initial carrier signal, wherein a frequency of the third version of the initial carrier signal is equal to the frequency of the initial carrier signal multiplied by a second multiplication factor; and the combiner forms the RF data signal using the baseband data signal and the third version of the initial carrier signal.

In some embodiments, the frequency multiplier comprises a first multiplier stage and a second multiplier stage; and for every two columns of the at least two columns, the first multiplier stage comprises a distributed local oscillator for generating the second version of the initial carrier signal; and for each column of the two columns, the second multiplier stage is coupled to the distributed local oscillator to receive the second version of the initial carrier signal and to generate the third version of the initial carrier signal.

In some embodiments, the first multiplication factor is two. In some embodiments, the second multiplication factor is four.

In some embodiments, the frequency of the version of the initial carrier signal is approximately 60 GHz.

In some embodiments, each RF signal launcher includes a stub for directing the RF data signal to the column of active antenna elements.

In some embodiments, the device further includes an enclosure layer mounted to the front face.

In some embodiments, the enclosure layer includes a radome. In some embodiments, the enclosure layer includes a lens, positioned to enclose the phased array of antenna elements.

In some embodiments, the rear face includes at least one spacer to maintain a substantially uniform distance between the substrate and the transmitting module.

In some embodiments, the spacer is positioned at each RF signal launcher.

In some embodiments, the spacer includes a solder stop.

In accordance with an embodiment, there is provided a radio frequency signal receiver having: a data signal port for transmitting a baseband data signal; a carrier signal port for receiving an initial carrier signal; and an antenna module coupled to each of the data signal port and the carrier signal port, the antenna module having: a substrate having: a front face having a phased array of active antenna elements, the phased array of active antenna elements including at least two columns of the active antenna elements; and a rear face opposite the front face, the rear face having, for each column of active antenna elements, a radio frequency (RF) signal launcher for receiving a RF data signal from the column of active antenna elements; and a receiving module mounted to the rear face of the substrate, the receiving module comprising, for each column of active antenna elements: a RF signal port coupled to the RF signal launcher to receive the RF data signal from the column of active antenna elements; and a detector to retrieve the baseband data signal from the RF data signal using a version of the initial carrier signal.

In some embodiments, a number of active antenna elements in each column is a power of two.

In some embodiments, each column includes a pair of passive antenna elements positioned at opposed ends of the column.

In some embodiments, each column is positioned substantially equidistant from a neighboring column.

In some embodiments, each column includes at least four active antenna elements.

In some embodiments, the receiving module includes: a frequency multiplier to receive the initial carrier signal from the carrier signal port and to convert the initial carrier signal to a second version of the initial carrier signal, wherein a frequency of the second version of the initial carrier signal is equal to a frequency of the initial carrier signal multiplied by a first multiplication factor; and the detector retrieves the baseband data signal using the second version of the initial carrier signal.

In some embodiments, the frequency multiplier converts the second version of the initial carrier signal to a third version of the initial carrier signal, wherein a frequency of the third version of the initial carrier signal is equal to the frequency of the initial carrier signal multiplied by a second multiplication factor; and the detector retrieves the baseband data signal using the third version of the initial carrier signal.

In some embodiments, the frequency multiplier includes a first multiplier stage and a second multiplier stage; and for every two columns of the at least two columns, the first multiplier stage comprises a distributed local oscillator for generating the second version of the initial carrier signal; and for each column of the two columns, the second multiplier stage is coupled to the distributed local oscillator to receive the second version of the initial carrier signal and to generate the third version of the initial carrier signal.

In some embodiments, the first multiplication factor is two. In some embodiments, the second multiplication factor is four.

In some embodiments, the frequency of the version of the initial carrier signal is approximately 60 GHz.

In some embodiments, each RF signal launcher includes a stub for directing the RF data signal to the RF signal port from the column of active antenna elements.

In some embodiments, the receiver includes an enclosure layer mounted to the front face.

In some embodiments, the enclosure layer comprises a radome.

In some embodiments, the enclosure layer comprises a lens positioned to enclose the phased array of antenna elements.

In some embodiments, the rear face comprises at least one spacer to maintain a substantially uniform distance between the substrate and the receiving module.

In some embodiments, a spacer is positioned at each RF signal launcher.

In some embodiments, the spacer comprises a solder stop.

In accordance with an embodiment, there is provided a data communication system having: a radio frequency (RF) signal transmitter having: a transmitter data signal port for receiving a baseband data signal; a transmitter carrier signal port for receiving an initial transmitter carrier signal; a transmitter substrate having: a front face having a phased array of active antenna elements, the phased array of active antenna elements including at least two columns of the active antenna elements; and a rear face opposite the front face, the rear face having, for each column of active antenna elements, a RF signal launcher to receive a RF data signal for the column of active antenna elements; and a transmitting module mounted to the rear face of the substrate, the transmitting module having, for each column of active antenna elements: a combiner to combine the baseband data signal and a version of the initial transmitter carrier signal to form the RF data signal; and a RF signal port to transmit the RF data signal to the RF signal launcher; and at least one RF signal receiver for receiving the RF data signal from the RF signal transmitter.

In some embodiments, the at least one RF signal receiver includes: a receiver data signal port for receiving the RF data signal; a receiver carrier signal port for receiving an initial receiver carrier signal; and a receiver substrate having: a front face having a phased array of active antenna elements, the phased array of active antenna elements including at least two columns of the active antenna elements; and a rear face opposite the front face, the rear face having, for each column of active antenna elements, a RF signal launcher; and a receiving module mounted to the rear face of the receiver substrate, the receiving module comprising, for each column of active antenna elements: a RF signal port coupled to the RF signal launcher to receive the RF data signal from the column of active antenna elements; and a detector to retrieve the baseband data signal from the RF data signal using a version of the initial receiver carrier signal.

In some embodiments, the system includes a steering module operable to: select a RF signal receiver from the at least one RF signal receiver for receiving the RF data signal from the RF signal transmitter; and generate a control signal for directing the RF signal transmitter to transmit the RF data signal to the selected RF signal receiver.

In some embodiments, the RF signal transmitter and the at least one RF signal receiver form a primary communication channel; and the system further includes a backchannel separate from the primary communication channel.

In some embodiments, the backchannel has a lower bandwidth than the primary communication channel.

In some embodiments, the backchannel includes: an input data port coupled to the RF signal transmitter for providing the transmitter data signal port with the baseband data signal; and an error module coupled to each RF signal receiver for generating a response signal representative of a quality of a data transmission between the RF signal transmitter and the respective RF signal receiver, and the error module is coupled to the input data port to transmit the response signal to the input data port.

In some embodiments, the backchannel operates on one of a wireless communications technology and a mobile communications technology.

In accordance with an embodiment, there is provided a transceiver having: a radio frequency (RF) signal transmitter having: a transmitter data signal port for receiving an outgoing baseband data signal; a transmitter carrier signal port for receiving an initial transmitter carrier signal; a transmitter substrate having: a front face having a phased array of active antenna elements, the phased array of active antenna elements including at least two columns of the active antenna elements; and a rear face opposite the front face, the rear face having, for each column of active antenna elements, a RF signal launcher to receive a RF data signal for the column of active antenna elements; and a transmitting module mounted to the rear face of the substrate, the transmitting module comprising, for each column of active antenna elements: a combiner to combine the outgoing baseband data signal and a version of the initial transmitter carrier signal to form the RF data signal; and a RF signal port to transmit the RF data signal to the RF signal launcher; a RF signal receiver having: a receiver data signal port for receiving an incoming RF data signal; a receiver carrier signal port for receiving an initial receiver carrier signal; and a receiver substrate having: a front face having a phased array of active antenna elements, the phased array of active antenna elements including at least two columns of the active antenna elements; and a rear face opposite the front face, the rear face having, for each column of active antenna elements, a RF signal launcher; and a receiving module mounted to the rear face of the receiver substrate, the receiving module comprising, for each column of active antenna elements: a RF signal port coupled to the RF signal launcher to receive the incoming RF data signal from the column of active antenna elements; and a detector to retrieve an incoming baseband data signal from the incoming RF data signal using a version of the initial receiver carrier signal; and an isolator separating the RF signal transmitter and the RF signal receiver.

In accordance with an embodiment, there is provided a bi-directional data communication system having: a master transceiver formed of a transceiver as described herein; and a slave transceiver coupled to communicate with the master transceiver, the slave transceiver being formed of a transceiver as described herein.

In accordance with an embodiment, there is provided a method of providing a radio frequency signal transmitter. The method includes: forming a phased array of active antenna elements within a substrate, the substrate having: a front face with the phased array of active antenna elements, the phased array of active antenna elements including at least two columns of the active antenna elements; and a rear face opposite the front face, the rear face having, for each column of active antenna elements, a radio frequency (RF) signal launcher to receive a RF data signal for the column of active antenna elements; and providing a data signal port on the rear face for receiving a baseband data signal; providing a carrier signal port on the rear face for receiving an initial carrier signal; and mounting a transmitting module to the rear face of the substrate, the transmitting module comprising, for each column of active antenna elements: a combiner to combine the baseband data signal and a version of the initial carrier signal to form the RF data signal; and a RF signal port to transmit the RF data signal to the RF signal launcher.

In some embodiments, mounting the transmitting module includes: providing a spacer on the rear face to maintain a substantially uniform distance between the substrate and the transmitting module.

In accordance with an embodiment, there is provided a method of providing a radio frequency signal receiver. The method includes: forming a phased array of active antenna elements within a substrate, the substrate having: a front face with the phased array of active antenna elements, the phased array of active antenna elements including at least two columns of the active antenna elements; and a rear face opposite the front face, the rear face having, for each column of active antenna elements, a radio frequency (RF) signal launcher; and providing a data signal port on the rear face for receiving a RF data signal; providing a carrier signal port on the rear face for receiving an initial carrier signal; and mounting a receiving module to the rear face of the substrate, the receiving module comprising, for each column of active antenna elements: a RF signal port coupled to the RF signal launcher to receive the RF data signal from the column of active antenna elements; and a detector to retrieve a baseband data signal from the RF data signal using a version of the initial carrier signal.

In some embodiments, mounting the receiving module includes: providing a spacer on the rear face to maintain a substantially uniform distance between the substrate and the receiving module.

BRIEF DESCRIPTION OF THE DRAWINGS

Several embodiments will now be described in detail with reference to the drawings, in which:

FIG. 2b shows a side view of the diagram of the antenna module of FIG. 2a;

FIG. 2c shows a rear view of the diagram of the antenna module of FIG. 2a;

FIG. 3b shows a side view of the diagram of the antenna module of FIG. 3a;

FIG. 10b shows a rear side of the substrate of FIG. 10a;

FIG. 11b is a partial view of the layout of FIG. 10c mounted with another component of the example transmitting module of FIG. 11a;

FIG. 12b shows a rear side of the substrate of FIG. 12a;

FIG. 13a is a partial view of the layout shown in FIG. 12c mounted with a component of an example receiving module;

FIG. 13b is a partial view of the layout shown in FIG. 12c mounted with another component of the example receiving module of FIG. 13a;

FIG. 18*a* is a top view of a substrate manufacturing jig for an antenna module in accordance with an example embodiment;

FIG. 18*b* is a side view of the substrate manufacturing jig of FIG. 18*a*; and

FIG. 18*c* is a perspective view of the substrate manufacturing jig of FIG. 18*a*.

Figure 1:
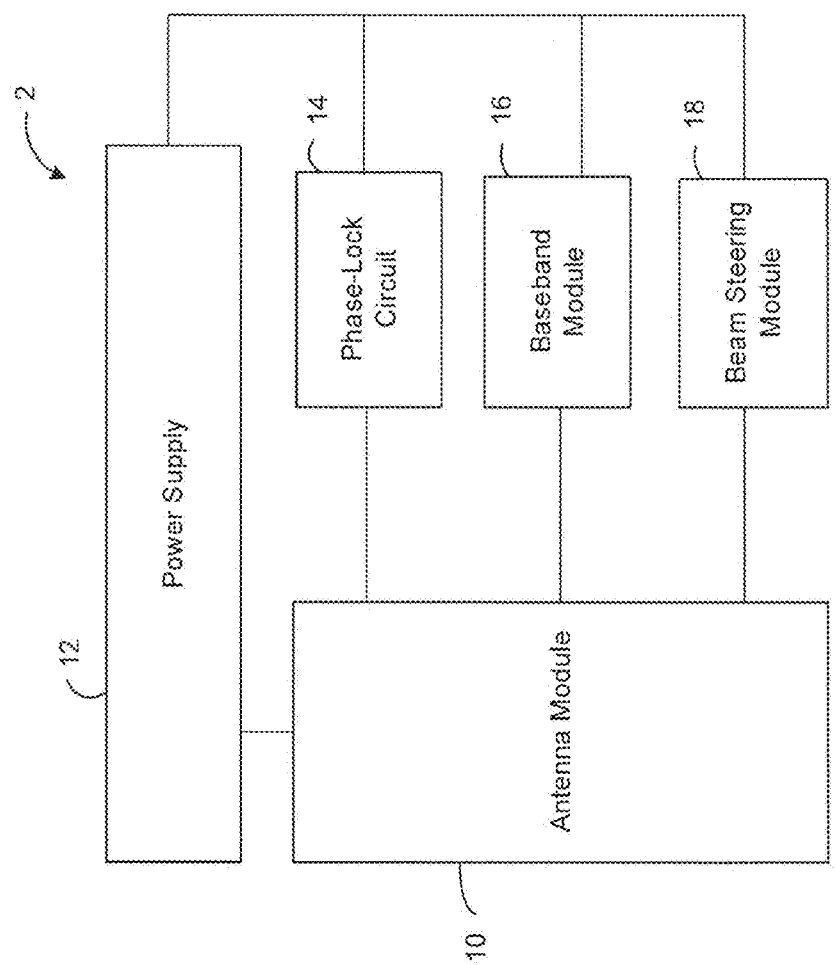
FIG. 1 is a block diagram of components interacting with an antenna module in accordance with an example embodiment.

The drawings, described below, are provided for purposes of illustration, and not of limitation, of the aspects and features of various examples of embodiments described herein. For simplicity and clarity of illustration, elements shown in the drawings have not necessarily been drawn to scale. The dimensions of some of the elements may be exaggerated relative to other elements for clarity. It will be appreciated that for simplicity and clarity of illustration, where considered appropriate, reference numerals may be repeated among the drawings to indicate corresponding or analogous elements or steps.

DESCRIPTION OF EXAMPLE EMBODIMENTS

Millimeter wave technology operates within a high frequency range of 30 to 300 GHz. The 60 GHz band falls within the millimeter wave range and has a range from 57 to 64 GHz.

The antenna modules and systems described herein can operate within the millimeter wave range. While the embodiments described herein are directed to operation within the 60 GHz band, the described antenna modules and systems can be adapted to operate within the other bands within the millimeter wave technology by adjusting the carrier frequency to the desired range.

Reference is now made to FIG. 1, which illustrates a block diagram 2 of components interacting with an antenna module 10. As shown in the block diagram 2, the antenna module 10 can interact with a power supply 12, a phase-lock circuit 14, a baseband module 16, and a beam steering module 18.

The power supply 12 supplies power to each of the antenna module 10, the phase-lock circuit 14, the baseband module 16, and the beam steering module 18. The power supply 12 can be provided as one or more separate power supply components and each of those power supply components can supply power to one or more of the components shown in the block diagram 2.

The phase-lock circuit 14 can identify a phase difference in the initial carrier signal (or versions of the initial carrier signal) from a reference signal. The phase-lock circuit 14 can then generate an error signal to synchronize the carrier signal with the reference signal. The phase-lock circuit 14 can be implemented as a phase-locked loop (PLL), in some embodiments.

The baseband module 16 can include a baseband interface for receiving an initial carrier signal from a baseband generating module. The initial carrier signal received from the baseband generating module can be the transmission carrier signal, which is the carrier wave at which the antenna module 10 is designed to transmit or receive data. The initial carrier signal received from the baseband generating module can be a fraction of the transmission carrier signal, and the antenna module 10 can apply one or more multiplication factors to convert the initial carrier signal to the transmission carrier signal.

The beam steering module 18 can generate control signals to direct a RF signal transmitter to transmit a RF data signal to one or more RF signal receivers that are located apart from the RF signal transmitter. The beam steering module 18 can identify the corresponding RF signal receivers from a look-up table, for example. The look-up table defines a steering range between the RF signal transmitter and each RF signal receiver, as well as a set out voltage for the phase shifter. A steering range in which the RF signal transmitter can direct the RF data signal at be at least ±30 degrees from boresight, in some embodiments.

For example, when multiple RF signal receivers are available within a data transmission system, the beam steering module 18 can select one or more RF signal receivers that are most suitable to receive the RF data signal from the antenna module 10, which can be a RF signal transmitter or a transceiver. Based on the selection of the RF signal receiver, the beam steering module 18 can generate a control signal to direct the antenna module 10 to transmit the RF data signal to the selected RF signal receiver.

In some embodiments, the beam steering module 18 can generate different control signals for each column of the active antenna elements at the antenna module 10 so that a different degree of steering can result.

The antenna module 10 can be a RF signal transmitter, RF signal receiver, or a transceiver. Depending on the design of the antenna module 10, the antenna module 10 can transmit and/or receive data signals according to the data signals provided by each of the phase-lock circuit 14, the baseband module 16, and the beam steering module 18.

Example embodiments of the antenna module 10 will be described herein with reference to at least FIGS. 2*a* to 13*b*.

Figure 2A:
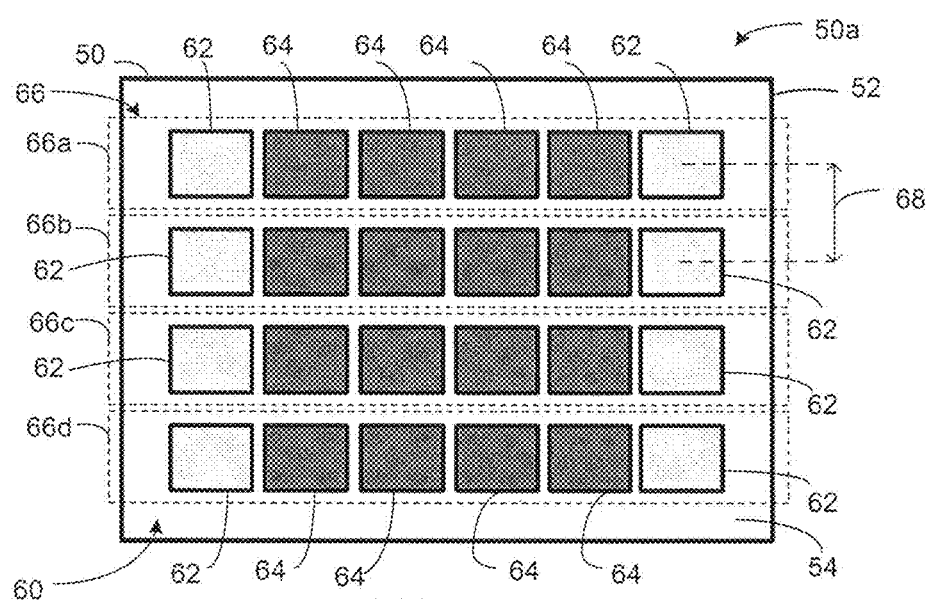
FIG. 2a shows a top view of a diagram of an antenna module in accordance with an example embodiment.
Figure 2B:
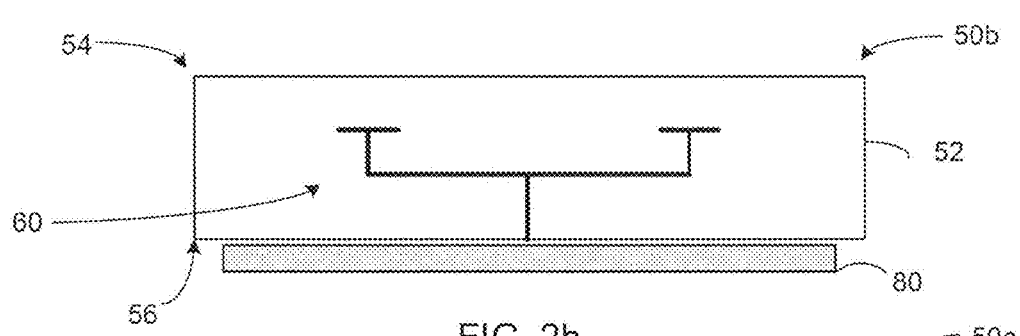
Figure 2C:
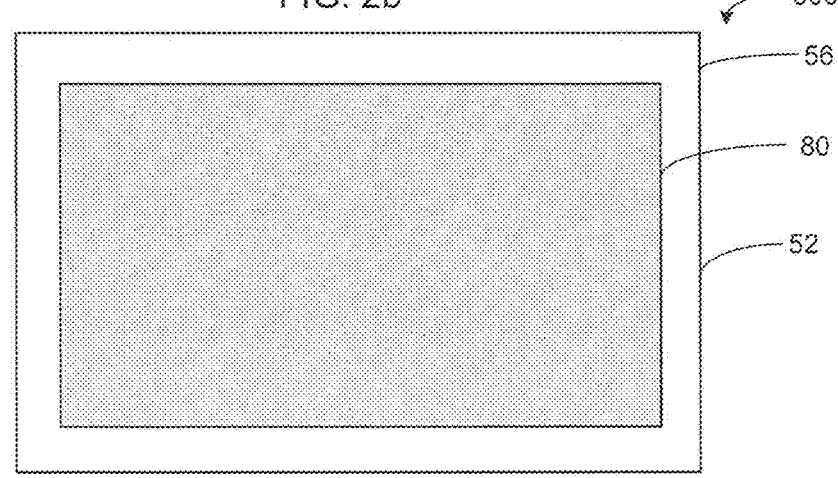

FIG. 2*a* shows a top view 50*a* of an example antenna module 50, FIG. 2*b* shows a side view 50*b* of the antenna module 50, and FIG. 2*c* shows a rear view 50*c* of the antenna module 50.

The antenna module 50 includes a substrate 52 with a front face 54 and a rear face 56 opposite the front face 54. As shown in FIGS. 2*a* and 2*b*, the front face 54 includes a phased array 60 of antenna elements that is embedded within the substrate 52. The phased array 60 can also be referred to as substrate integrated waveguide (SIW) or active electronically scanned array (AESA). The phased array 60 includes an array of antennas in which the relative phases of the signals that are fed to each active antenna element 64 can be steered towards desired directions.

The phased array 60 of antenna elements is structured into at least two columns 66, such as columns 66*a* to 66*d* shown in FIG. 2*a*. Each column 66 includes active antenna elements 64 and a pair of passive antenna elements 62 that are positioned at opposite ends of each column 66. The number of active antenna elements in each column varies with the structure of the phased array 60. In some embodiments, the number of active antenna elements in each column is a power of two.

When the antenna module 50 is designed to be a RF signal transmitter, the active antenna elements 64 operate to radiate the RF data signal away from the antenna module 50. When the antenna module 50 is designed to be a RF signal receiver, the active antenna elements 64 operate to receive the RF data signal.

The passive antenna elements 62 act as resistive terminators for each column 66. Each passive antenna element 62 can have a resistance of 50Ω, for example. In the example shown in FIGS. 2a to 2c, each column 66 includes four active antenna elements 64. The number of columns 66 can vary with the intended application of the antenna module 50. For example, the dimension of the antenna elements 64 can depend on a center frequency for which the antenna module 50 is designed. For example, other dimensions of the antenna elements 64 can include rectangular structures, such as eight columns with eight antenna elements 64 each, or sixteen columns with sixteen antenna elements 64 each. When the number of columns 66 increases, the overall antenna gain can increase and the beam width can be narrowed. As a result, the RF data signal to be transmitted by the active antenna elements 64 can be steered with greater accuracy.

As shown in FIGS. 2a to 2c, each column 66 is positioned substantially equidistant from its neighboring column 66. A column distance 68 between neighboring columns 66 can be approximately half the wavelength of the carrier frequency for which the antenna module 50 is designed. For example, when the antenna module 50 is designed for a carrier frequency of 60 GHz, the column distance 68 can be 2.5 mm since the wavelength is 5 mm. The column distance 68 is measured from a center of one column 66 to a center of its neighboring column 66.

In some embodiments, the column distance 68 can vary between each pair of neighboring columns 66. The column distance 68 may decrease moving from the center of the substrate 52 to either edge of the substrate 52. For example, a column distance 68 between columns 66b and 66c can be greater than a column distance 68 between each of columns 66b and 66a, and columns 66c and 66d.

As shown in FIGS. 2b and 2c, the rear face 56 is mounted with a RF module 80. Depending on the application of the antenna module 50, the RF module 80 can be a transmitting module or a receiving module. Example embodiments of the transmitting module and the receiving module will be described with reference to, at least, FIGS. 4 to 13b.

Figure 3A:
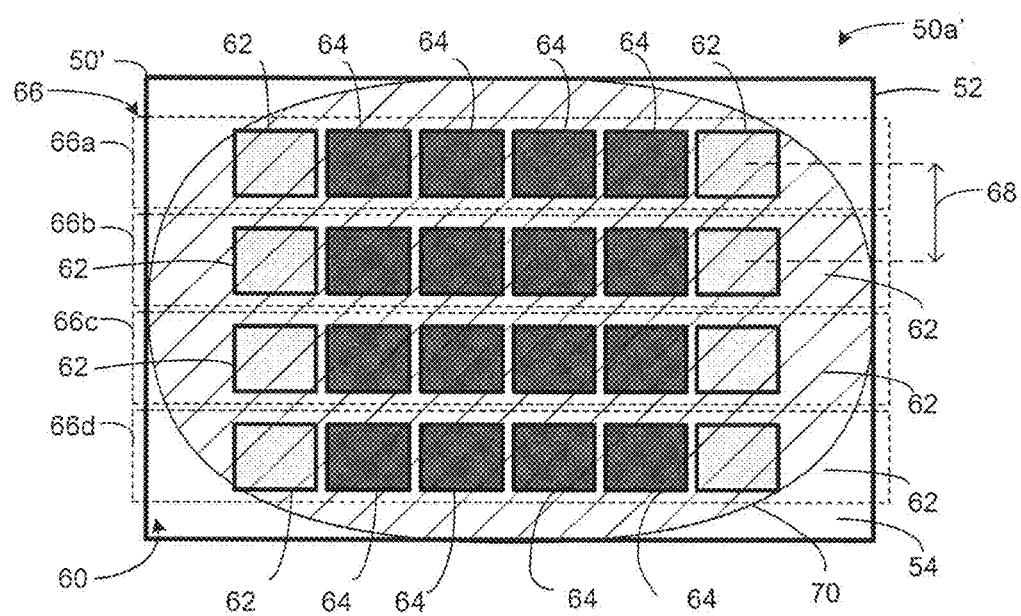
FIG. 3a shows a top view of a diagram of another antenna module in accordance with an example embodiment.

FIGS. 3a and 3c show another example embodiment of the antenna module 50 shown in FIGS. 2a to 2c.

Figure 3B:
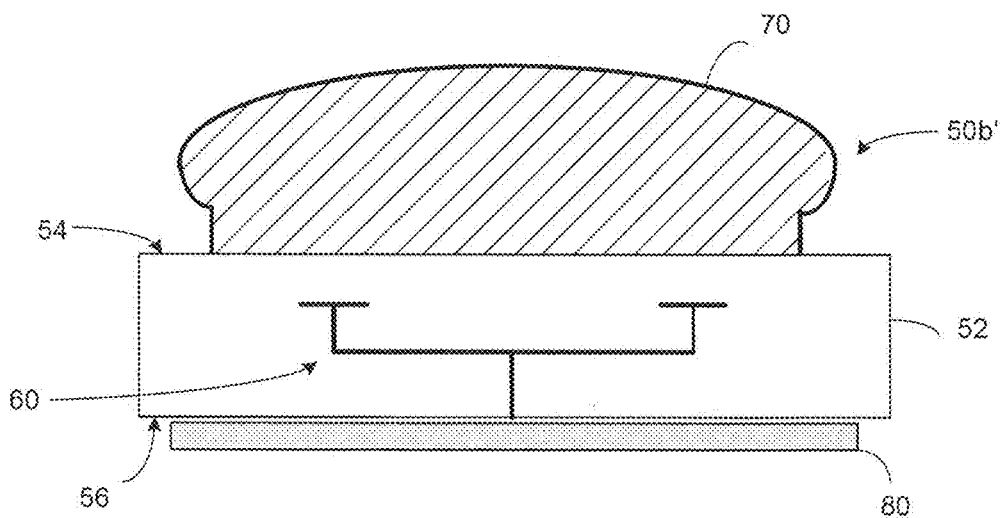

FIG. 3a shows a top view 50a' of an example antenna module 50' and FIG. 3b shows a side view 50b' of the antenna module 50'. The antenna module 50' includes a lens 70 as an enclosure layer. The lens 70 encloses the phased array of antenna elements 60. The lens 70 can improve a gain of the active antenna elements 64 by focusing the beam radiating from the active antenna elements 64. The lens 70 can also increase a range of the steering angle.

The enclosure layer can protect the phased array 60 from any harmful effects resulting from being exposed to the environment, such as humidity, dust, and other related effects.

In some embodiments, the enclosure layer may be formed as a radome that is mounted to the front face 54. The radome can be mounted at the edges of the front face 54 to avoid affecting the operation of the phased array 60. The radome may be formed with Mylar™, for example.

The enclosure layer is optional. The antenna module 50 may be located in a relatively clean environment, or any resulting effect of the environment will have minimal impairment to the operation of the antenna module 50. The antenna module 50 may be placed into a protective case that can limit the effect of the environment.

In some other embodiments, instead of mounting an enclosure layer to the front face 54, a silicon edge sealant can be applied to the front face 54 to act as physical protection for the phased array 60.

Figure 4:
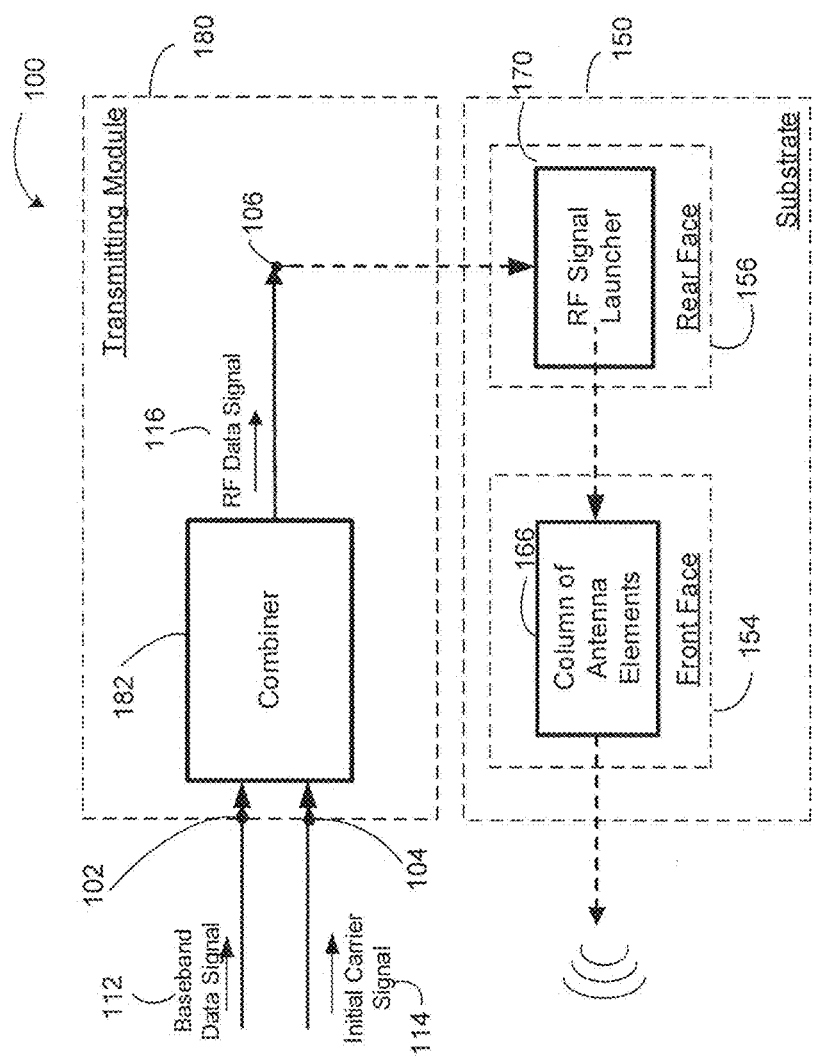
FIG. 4 is a block diagram of an example radio frequency (RF) signal transmitter in accordance with an example embodiment.

FIG. 4 is a block diagram of an example RF signal transmitter 100.

The RF signal transmitter 100 includes a data signal port 102 for receiving a baseband data signal 112, a carrier signal port 104 for receiving an initial carrier signal 114, a substrate 150 with a front face 154 opposite to a rear face 156, and a transmitting module 180.

The initial carrier signal 114 can be the transmission carrier signal, or a version of the transmission carrier signal. For example, if the RF signal transmitter 100 is designed to operate within the 60 GHz band, the initial carrier signal 114 received at the carrier signal port 104 can be the transmission carrier signal (e.g., 60 GHz), or a version of the transmission carrier signal. The version of the transmission carrier signal can be a fraction of the transmission carrier signal, such as half of the transmission carrier signal or a quarter of the transmission carrier signal.

When the RF signal transmitter 100 receives a version of the transmission carrier signal as the initial carrier signal 114, the transmitting module 180 can multiply the received version of the transmission carrier signal to generate the transmission carrier signal. The multiplication stage can include one or more stages.

As described with reference to FIGS. 2a to 2c, the front face 154 has a phased array 60 of active antenna elements 64. The active antenna elements 64 are structured into one or more columns 66. In the RF signal transmitter 100, a transmitting module 180 is mounted to the rear face 156 for each column 166 of active antenna elements 64.

The transmitting module 180 includes a combiner 182 that receives the baseband data signal 112 from the data signal port 102 and the initial carrier signal 114 from the carrier signal port 104. The combiner 182 can modulate the baseband data signal 112 and a version of the initial carrier signal 114 to form a RF data signal 116. The version of the initial carrier signal 114 modulated with the baseband data signal 112 is the transmission carrier signal. In the embodiments in which the initial carrier signal 114 is not the transmission carrier signal, the combiner 182 can include at least one of the multiplication stages for generating the transmission carrier signal from the initial carrier signal 114 or a version of the initial carrier signal.

The combiner 182 then couples the RF data signal 116 to a RF signal port 106. The RF signal port 106 transmits the RF data signal to a RF signal launcher 170 formed on the rear face 156 of the substrate 150. The rear face 156 includes a RF signal launcher 170 for each column 166 of active antenna elements 64. Each RF signal launcher 170 receives the RF data signal 116 from the RF signal port 106 and couples the RF data signal 116 to the respective column 166 of active antenna elements 64.

Figure 5:
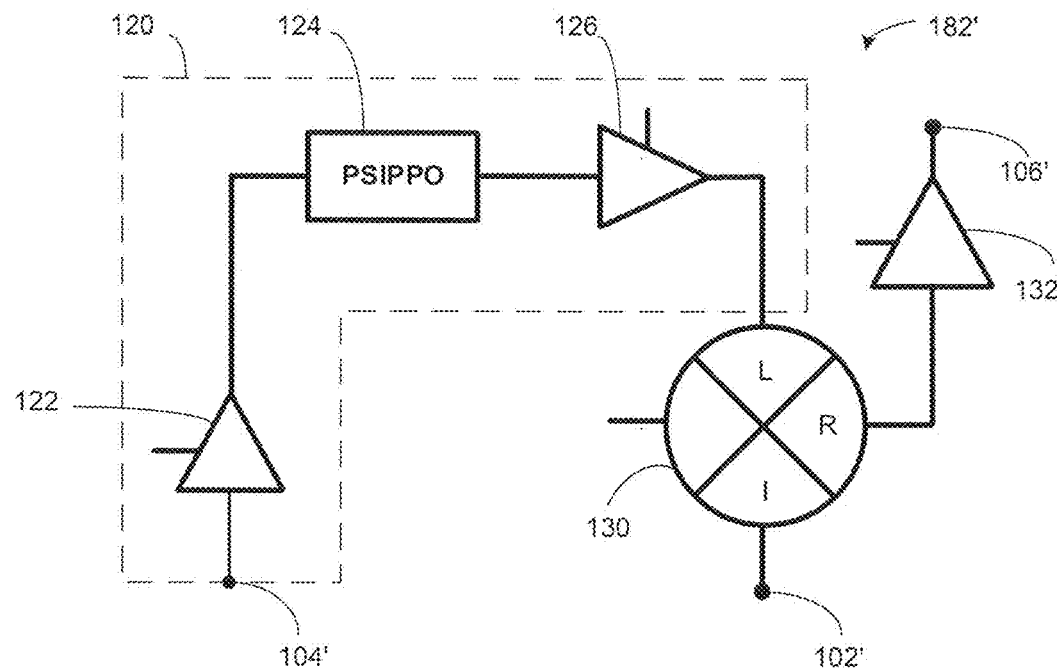
FIG. 5 is a schematic of a circuit of an example transmitting module, in accordance with an example embodiment.

FIG. 5 is a schematic of a circuit of an example transmitting module 182'.

The example transmitting module 182' includes a frequency multiplier 120, a mixer 130 and a power amplifier 132.

The frequency multiplier 120 includes a carrier signal port 104' coupled to a first amplifier 122, a phased shift injection push-push oscillator (PSIPPO) 124, and a second amplifier 126.

The PSIPPO can include a power divider, a time delay unit, a band rejection filter ("BRF"), at least two reflection amplifiers, and a power combiner.

The PSIPPO can receive an input signal with an input signal phase and can then generate an output signal with an output signal phase. The output signal phase can be the same or difference phase from the input signal phase. For example, depending on the design of the PSIPPO, the output signal can have twice the frequency and about twice the phase angle of the input signal.

In an example implementation of the PSIPPO, the power divider can receive the input signal and inject a first portion of the input signal into the band rejection filter. The power divider can inject a second portion of the input signal into the band rejection filter via the time delay unit. The time delay unit can cause a time delay of about half a period of the input signal. The signals being injected into the band rejection filter have the same power level but are opposite in phase.

The band rejection filter generates a first band filtered signal and a second band filtered signal. A phase of the first and second band filtered signals with respect to the input signal can be shifted in the range of about ±100 degrees. Each of the first and second band filtered signals is fed to a respective reflection amplifier, which generates first and second modified output signals.

The first and second modified output signals are fed to a combiner, which generates the output signal for the PSIPPO.

Referring still to FIG. 5, the first amplifier 122 modulates the initial carrier signal 114 received at the carrier signal port 104'. The PSIPPO 124 converts the initial carrier signal 114 by applying a first multiplication factor to generate a second version of the initial carrier signal 114, or converts a version of the initial carrier signal 114 by applying a second multiplication factor to generate a third version of the initial carrier signal 114. The second amplifier 126 receives the output signal from the PSIPPO 124.

The carrier signal port 104' may be coupled to the carrier signal port 104 and receives the initial carrier signal 114. The frequency multiplier 120 can apply a first multiplication factor to the initial carrier signal 114 received at the carrier signal port 104' to convert the initial carrier signal 114 to a second version of the initial carrier signal 114. For example, when the RF signal transmitter 100 is designed to operate at a transmission carrier signal of 60 GHz and the initial carrier signal 114 is 30 GHz, the frequency multiplier 120 can apply a first multiplication factor of two to the initial carrier signal 114 to generate the second version of the initial carrier signal 114 (e.g., doubling the initial carrier signal 114), which is the transmission carrier signal. In another example, the initial carrier signal 114 can be 15 GHz and the frequency multiplier 120 can then apply a first multiplication factor of four to the initial carrier signal 114 to generate the second version of the initial carrier signal 114. Other multiplication factors may be applied as necessary.

In some other embodiments, the carrier signal port 104' may receive a version of the initial carrier signal 114. The initial carrier signal 114 may first be transmitted to another component and converted to the second version of the initial carrier signal 114 with the application of a first multiplication factor, and the second version of the initial carrier signal 114 is provided to the frequency multiplier 120 to generate a third version of the initial carrier signal 114 with the application of a second multiplication factor.

Figure 6:
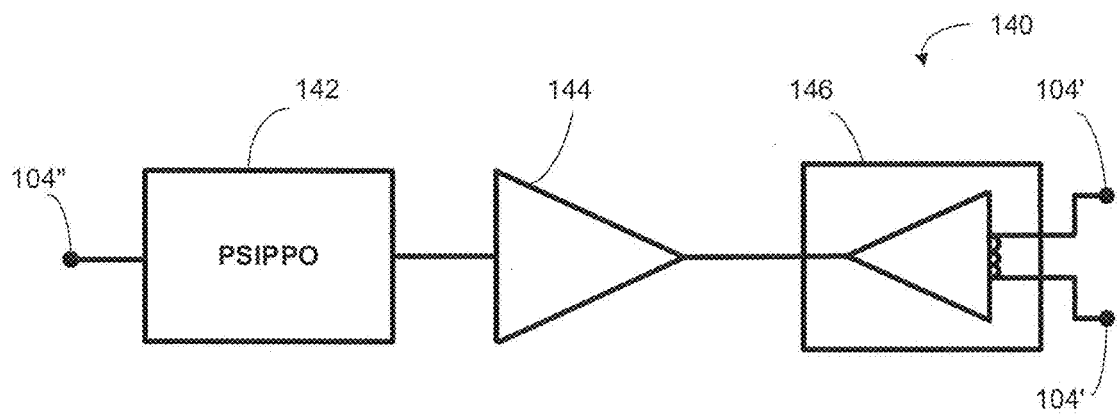
FIG. 6 is a schematic of a circuit of another component for the example transmitting module of FIG. 5, in accordance with an example embodiment.

FIG. 6 shows a schematic of an example circuit for a frequency multiplier 140 that can generate the second version of the initial carrier signal 114 and provide the second version of the initial carrier signal 114 to the frequency multiplier 120.

The frequency multiplier 140 includes a PSIPPO 142, an amplifier 144, and a power divider 146. The frequency multiplier 140 shown in FIG. 6 is intended to provide the second versions of the initial carrier signals 114 to a pair of transmitting modules 182'.

The frequency multiplier 140 has a carrier signal port 104" that may be coupled to the carrier signal port 104 to receive the initial carrier signal 114. The PSIPPO 142 converts the initial carrier signal 114 received at the carrier signal port 104" to a second version of the initial carrier signal 114 by multiplying a frequency of the received initial carrier signal 114 by a first multiplication factor. The amplifier 144 receives the second version of the initial carrier signal 114 from the PSIPPO 142 and transmits the second version of the initial carrier signal 114 to the power divider 146.

The power divider 146 can generate a pair of the second version of the initial carrier signal 114 for two respective transmitting modules at 104'. The power divider 146 can be implemented with different components, such as a Wilkinson Power Divider.

In an example embodiment, when the RF signal transmitter 100 is designed to operate at a transmission carrier signal of 60 GHz and the initial carrier signal 114 is 15 GHz, the frequency multiplier 140 can apply a first multiplication factor of two to the initial carrier signal 114 to generate the second version of the initial carrier signal 114 (e.g., 30 GHz). The second version of the initial carrier signal 114 can then be transmitted to the frequency multiplier 120. The frequency multiplier 120 can convert the second version of the initial carrier signal 114 to generate a third version of the initial carrier signal 114 by applying a second multiplication factor. A frequency of the third version of the initial carrier signal 114 can be a frequency of the initial carrier signal 114 multiplied by a second multiplication factor. In this example, the second multiplication factor can be four so that the third version of the initial carrier signal 114 is converted to the transmission carrier signal at 60 GHz.

The frequency multiplier 140, in some embodiments, may be implemented as a distributed local oscillator ("DLO").

The frequency multiplier 120 transmits a version of the initial carrier signal 114 to the mixer 130. The mixer 130 includes three terminals, a local oscillator terminal ("L") coupled to the frequency multiplier 120 for receiving the version of the initial carrier signal 114, a baseband terminal ("I") 102' coupled to the data signal port 102 for receiving the baseband data signal 112, and a RF signal terminal ("R") for transmitting the RF data signal 116 to the power amplifier 132 to transmit to the RF signal port 106.

The baseband data signal 112 received at the data signal port 102 may have a frequency within a range of approximately 3 GHz. The mixer 130 can modulate the baseband data signal 112 into the transmission carrier signal to generate the RF data signal 116.

Figure 7:
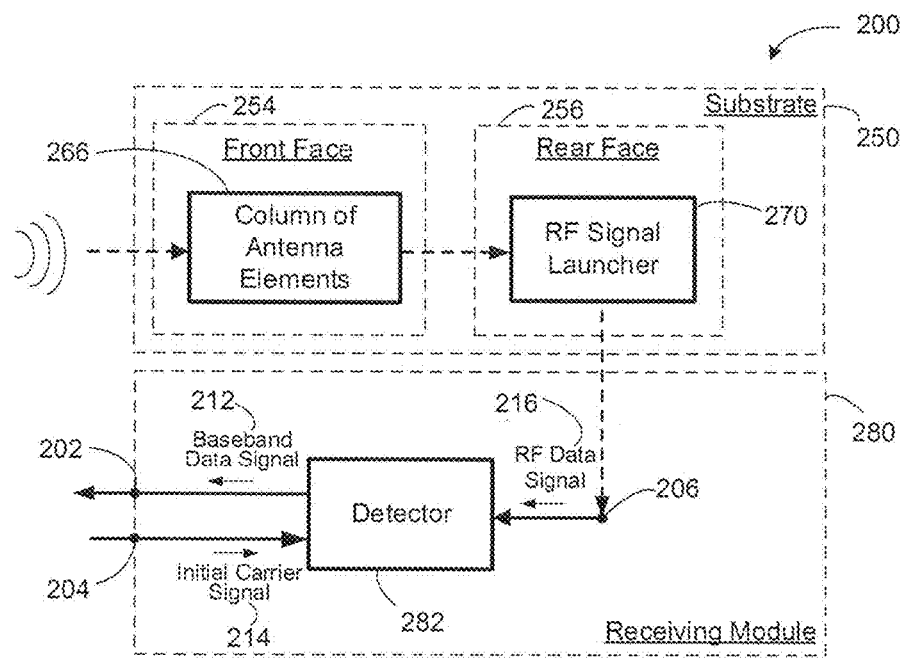
FIG. 7 is a block diagram of an example RF signal receiver in accordance with an example embodiment.

FIG. 7 is a block diagram of an example RF signal receiver 200.

The RF signal receiver 200 includes a substrate 250 with a front face 254 opposite to a rear face 256, and a receiving module 280. At the receiving module 280, there is a data signal port 202 for transmitting a baseband data signal 112 from the RF signal receiver 200, and a carrier signal port 204 for receiving an initial carrier signal 214.

The front face 254 has a phased array 60 of active antenna elements 64. The active antenna elements 64 are structured into one or more columns 266. In the RF signal receiver 200, a RF signal launcher 270 is mounted to the rear face 256 for each column 266 of active antenna elements 64. The RF signal launcher 270 receives the RF data signal from the respective column 266 of active antenna elements 64 and transmits the RF data signal 216 to the RF signal port 206 coupled to the RF signal launcher 270.

For each column 266, the receiving module 280 includes a detector 282 that retrieves the baseband data signal 212 from the RF data signal 216 using a version of the initial carrier signal 114.

Similar to the RF signal transmitter 100, the initial carrier signal 214 can be the transmission carrier signal, or a fraction of the transmission carrier signal. For example, if the RF signal receiver 200 is designed to operate within the 60 GHz band, the initial carrier signal 214 received at the carrier signal port 204 can be the transmission carrier signal (e.g., 60 GHz), or a fraction of the transmission carrier signal.

Figure 8:
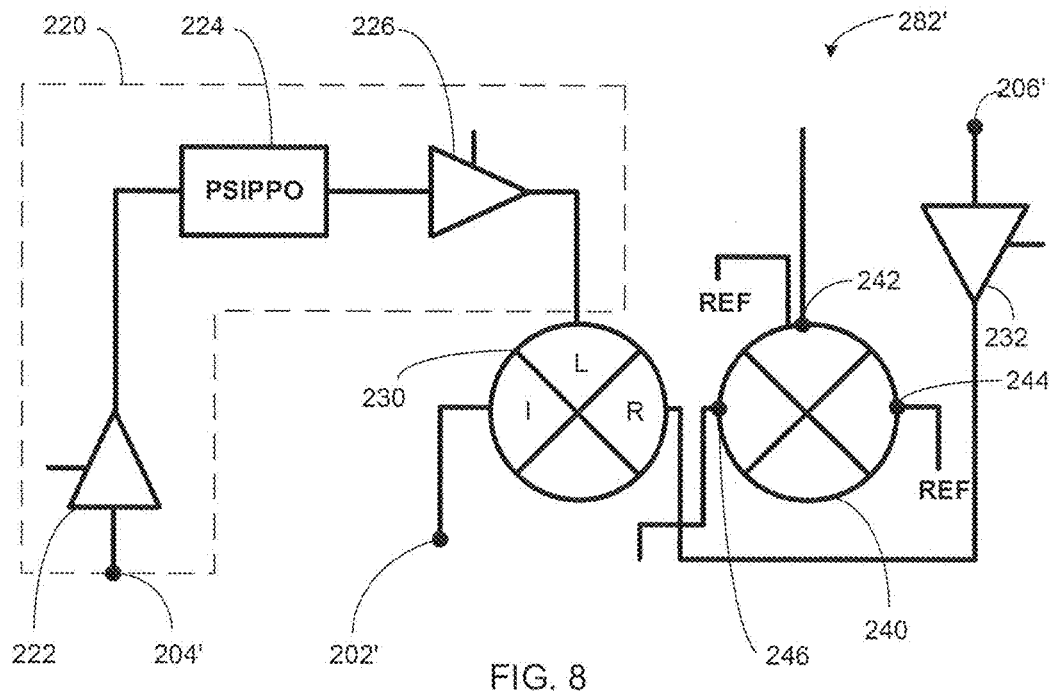
FIG. 8 is a schematic of a circuit of an example receiving module, in accordance with an example embodiment.

FIG. 8 shows a schematic of a circuit of an example receiving module 282'. The receiving module 282' includes a frequency multiplier 220, a mixer 230, a phase detector 240, and a power amplifier 232.

The frequency multiplier 220 of FIG. 8 is similar to the frequency multiplier 120 of FIG. 5. The frequency multiplier 220 includes a carrier signal port 204' coupled to a first amplifier 222, a PSIPPO 224, and a second amplifier 226.

The first amplifier 222 receives the initial carrier signal 214 from the carrier signal port 204'. The PSIPPO 224 converts the initial carrier signal 214 by applying a first multiplication factor to generate a second version of the initial carrier signal 214, or converts a version of the initial carrier signal 214 by applying a second multiplication factor to generate a third version of the initial carrier signal 214. The second amplifier 226 receives the version of the initial carrier signal 214 from the PSIPPO 224.

In some embodiments, the frequency multiplier 140 shown in FIG. 6 can also be provided at RF signal transmitter 100 to generate a second version of the initial carrier signal 214 for the receiving module 282'. The frequency multiplier 140 can act as a first stage multiplier and the frequency multiplier 220 can act as a second stage multiplier.

The mixer 230 has a local oscillator terminal ("L") coupled to the frequency multiplier 220 for receiving the version of the initial carrier signal 214, a baseband terminal ("I") 202' coupled to the data signal port 202 for transmitting the retrieved baseband data signal 212, and a RF signal terminal ("R") for receiving the RF data signal 216 from the RF signal port 206' via the power amplifier 232. The RF signal port 206' receives the RF data signal 216 from the RF signal port 206 shown in FIG. 7.

When the RF data signal 216 is received at the RF signal terminal ("R"), the mixer 230 retrieves the baseband data signal 212 using the version of the initial carrier signal 214 received at the local oscillator terminal ("L"). The mixer 230 then transmits the baseband data signal 212 from the baseband terminal ("I") 202'.

The phase detector 240 provides coherent detection through phase locking. By incorporating coherent detection into the receiving module 282', the exact carrier can be locked. The phase detector 240 operates to ensure that the version of the initial carrier signal 214 received at the local oscillator terminal ("L") corresponds to a desired phase.

The phase detector 240 has a phase detector input terminal 242, a reference terminal 244, and a phase detector output terminal 246. The phase detector input terminal 242 receives the RF data signal 216 and a reference signal ("REF"), and the reference terminal 244 also receives the reference signal ("REF"). By comparing the phase of each of the RF data signal 216 and the reference signal, the phase detector 240 can determine whether there is a phase difference between the RF data signal 216 and the reference signal, and generate an error signal representing the phase difference at the phase detector output terminal 246. In some embodiments, REF may be ground.

The phase detector output terminal 246 is coupled to a free running voltage-controlled oscillator (VCO) that generates a frequency according to the error signal. For example, the VCO can provide a nominal 15 GHz.

The RF signal transmitter 100 and RF signal receiver 200 can be implemented with different structures described with reference to, at least, FIGS. 9 to 13b.

Figure 9:
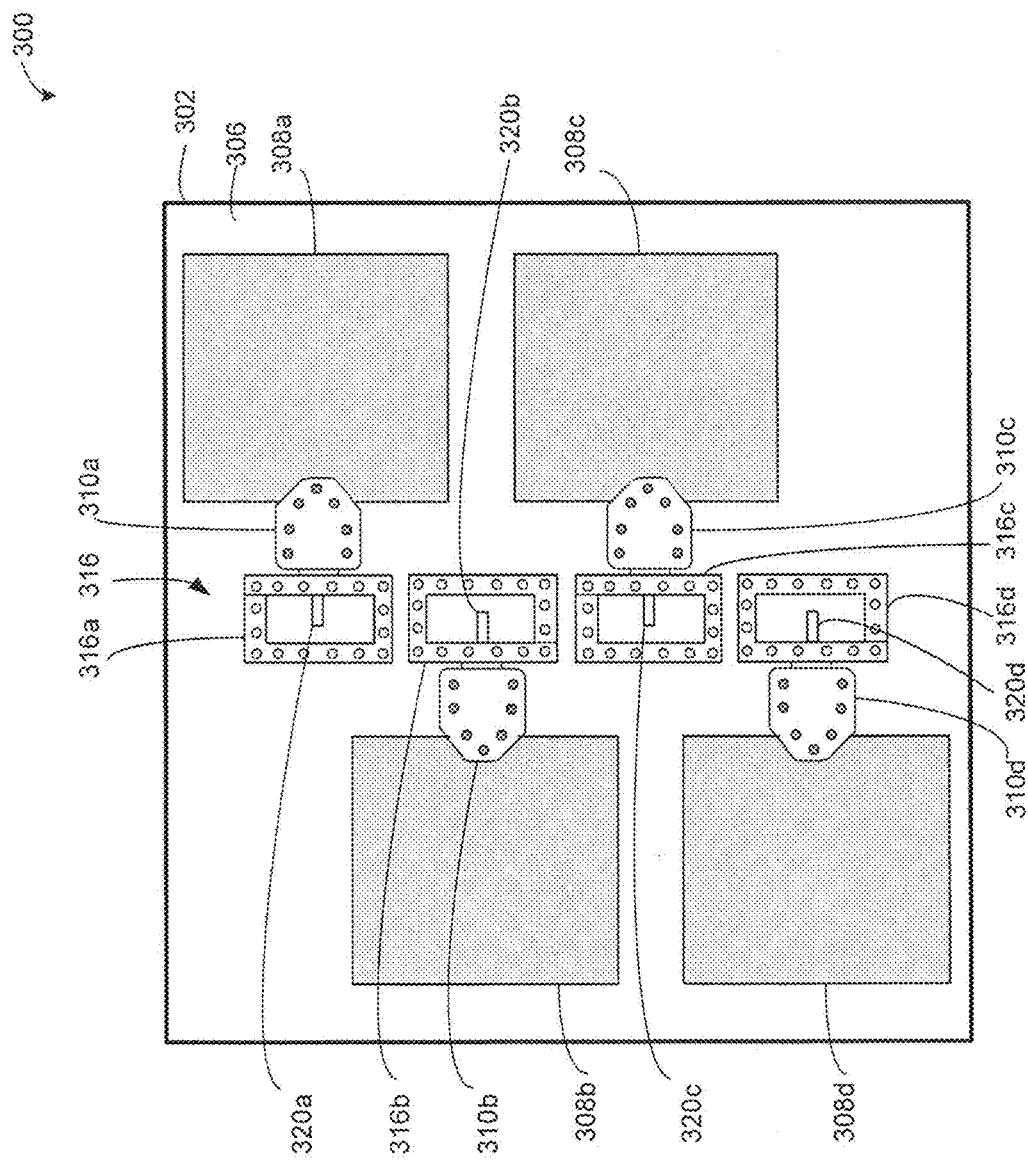
FIG. 9 is a schematic of a rear view of an antenna module in accordance with another example embodiment.

FIG. 9 is a schematic diagram of a rear view of an antenna module 300.

The antenna module 300 has a substrate 302 with a rear face 306 on which RF modules 308a to 308d are mounted. The RF modules 308a to 308d can be transmitting modules or receiving modules depending on the design of the antenna module 300.

Each of the RF modules 308a to 308d is coupled to a respective RF signal launcher 320a to 320d via a coupling element 310a to 310d, respectively. Each subsequent RF module 308a to 308d is positioned at a 180° offset from the other. A phase shift of 45° can be applied to the initial carrier signal 114 to compensate for the 180° offset.

As shown in FIG. 9, the RF signal launchers 320a to 320d are provided as a stub. Each stub 320a to 320d couples the respective RF module 308a to 308d to the column 66 of active antenna elements 64. Column ports 316a to 316d are shown on FIG. 9. Each column port 316 connects to a power of two number of active antenna elements 64.

The stub 320 can be printed onto the rear face 306 of the substrate 302, and aligned with the respective column port 316. The stub 320 is formed with a dimension that can match the impedance of the space with which it will interact. For example, when the rear face 306 is exposed to free space, the stub 320 can be formed with a dimension that can provide 350 to match the impedance of free space.

The substrate 302 can be formed with multiple layers that alternate between ground planes and signal carrying layers. The substrate 302 may be formed with stripline technology. For example, the substrate 302 can be formed from a first set of layers that form the phased array 60, and a second set of layers that form the interconnect layers between the phased array 60 and the RF modules 308.

Each layer can be formed using FERRO™'S A6 low temperature co-fired ceramic (LTCC) system. The metallic elements in each of the layers may be formed of various different materials, such as gold or silver. The metallic elements on the final interface layer (e.g., the rear face 306) can be formed of a material that is more reliable for solder attachment, such as silver-platinum (AgPt).

The interconnect layers include the layer forming the rear face 306 of the substrate 302 and are substantially RF transparent. Aligning each stub 320a to 320d with the respective column port 316a to 316d facilitates direct insertion of the RF data signal 116 to the respective column 166 or direct reception of the RF data signal 216 from the respective column 266.

When the RF modules 308a to 308d are transmitting modules, the RF signal launcher 320a to 320d directs the RF data signal 116 from the RF modules 308a to 308d to a respective column 66 of active antenna elements 64. When the RF modules 308a to 308d are receiving modules, the RF signal launcher 320a to 320d receives the RF data signal 216 from respective column 66 of active antenna elements 64 and directs the RF data signal 216 to the RF modules 308a to 308d.

Another example embodiment of the RF signal transmitter 100 and the RF signal receiver 200 are described with reference to FIGS. 10a to 13b.

Figure 10A:
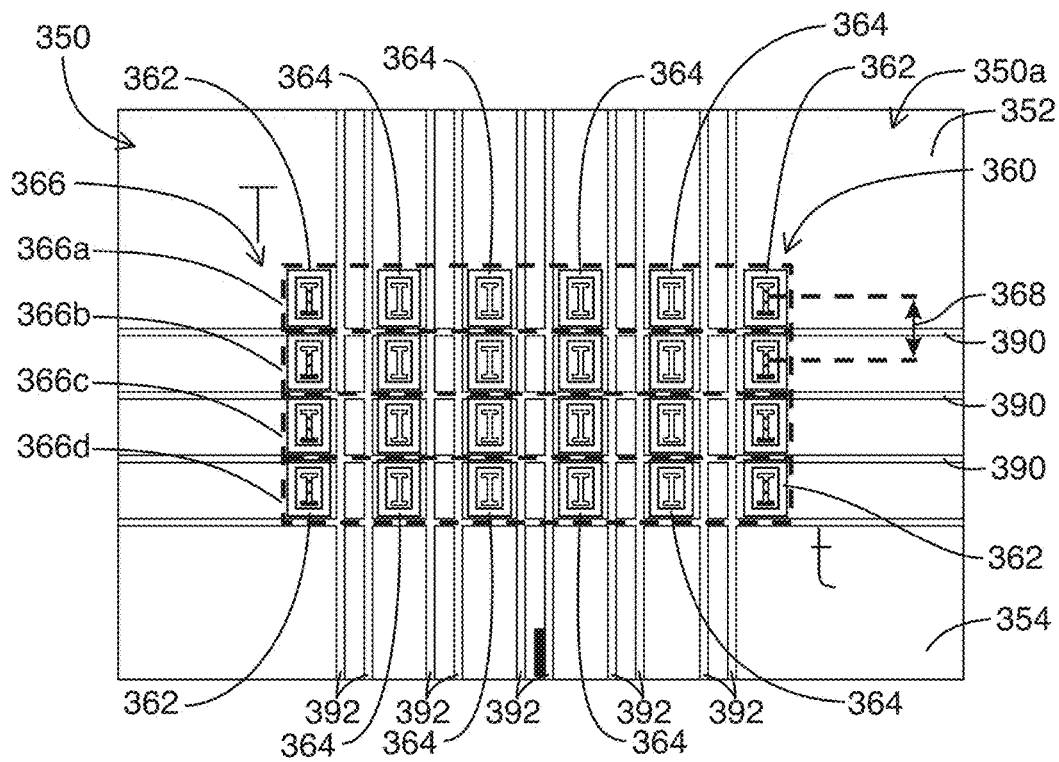
FIG. 10a is a top view of a substrate for an antenna module in accordance with another example embodiment.
Figure 10B:
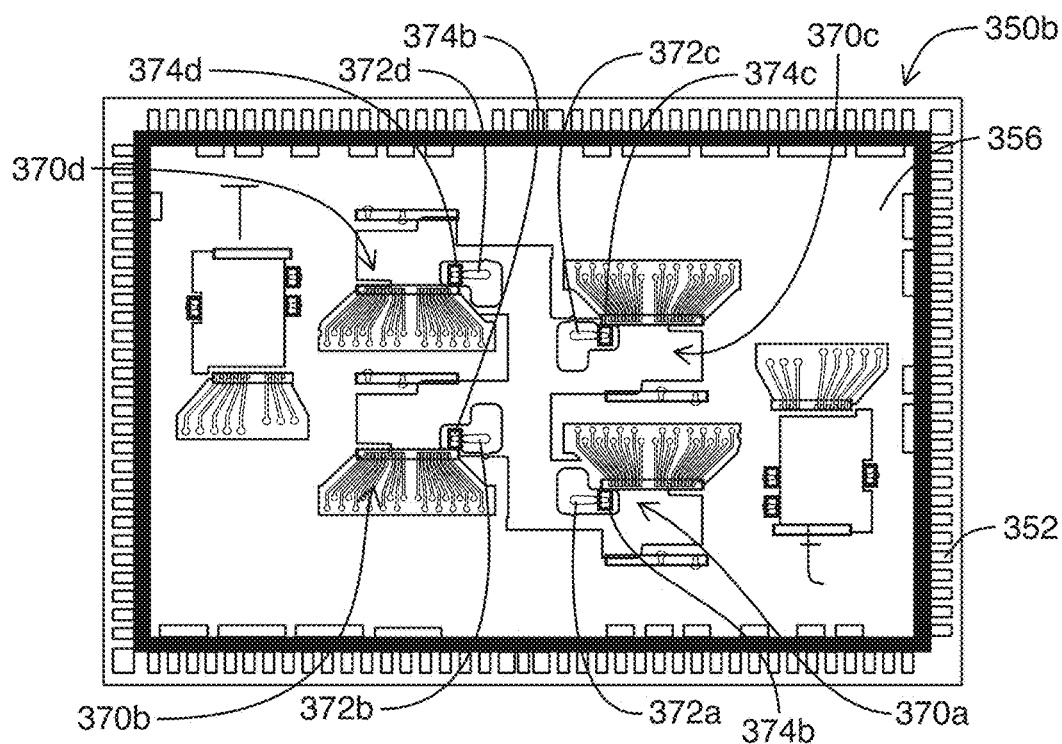

FIG. 10a is a top view 350a of a substrate 352 for an antenna module 350, and FIG. 10b is a rear view 350b of the substrate 352. The substrate 352 has a front face 354 and a rear face 356.

The front face 354 has a phased array 360 of antenna elements 364 formed in columns 366, namely columns 366a to 366d. Each column 366 is terminated by a pair of passive elements 362. Each neighboring column 366 is separated from each other by a column distance 368. The column distance 368 for the example substrate 352 shown in FIG. 10a is substantially equidistant. In some other embodiments, the column distance 368 may vary.

As shown in FIG. 10a, the substrate 352 also includes grooves 390 between each neighboring columns 366 and a pair of grooves 392 between each neighboring antenna elements 362, 364. The grooves 390 and 392 provide isolation for each of the antenna elements 362, 364. The grooves 390 and 392 may be formed with a diamond turning process, for example. The dimension of the grooves 390 and 392 vary with the intended carrier wave for which the antenna module 350 is designed.

The RF modules 180, 280 can be mounted to the substrate 352 directly, such as with flip chip mounting. The RF modules 180, 280 may be mounted using ball grid array (BGA).

When the RF modules 180, 280 are directly mounted to the substrate 352, a spacing between the RF module 180, 280 and the substrate 352 can be more accurately controlled, such as with a solder stop (as will be described with reference to FIG. 11c). The spacing between the RF module 180, 280 and the substrate 352 provide an air gap. A dimension of the air gap can be designed to provide a resistance range of approximately 25 to 100Ω, for example. Wire bonding can involve thick bonds that can generate dielectric losses. Direct bonding, on the other hand, offer low inductance due to the coupling between the RF module 380 and the substrate 352.

Figure 12A:
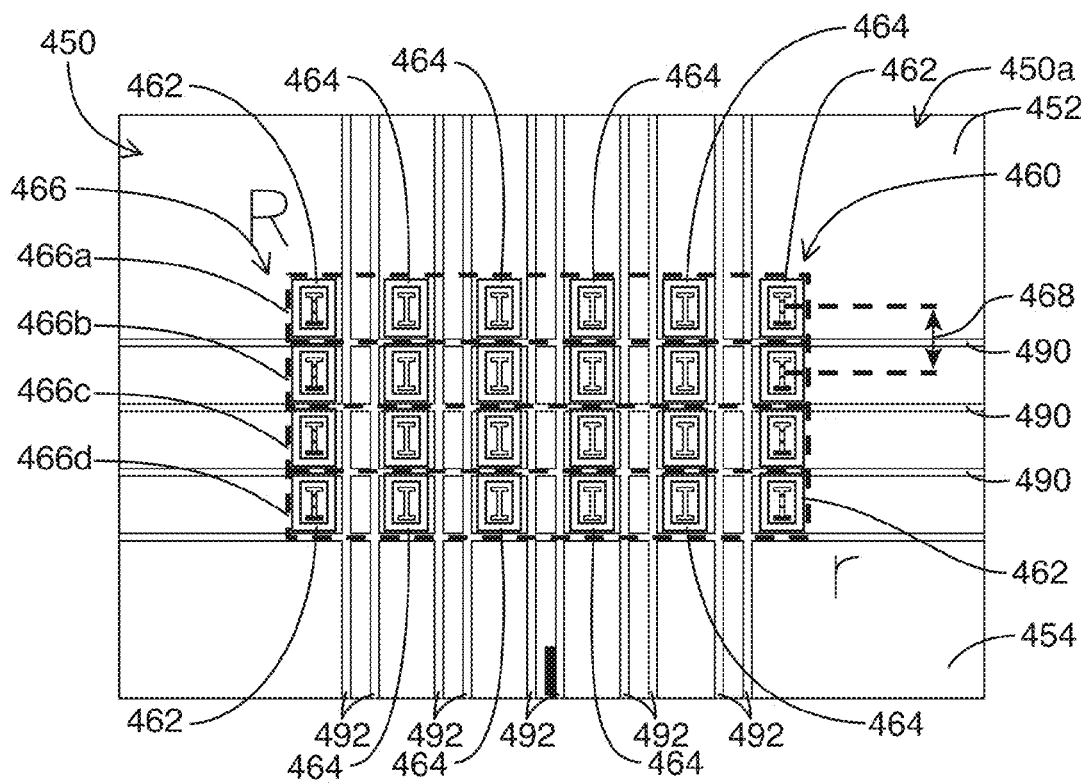
FIG. 12a is a top view of a substrate for an antenna module in accordance with another example embodiment.
Figure 12B:
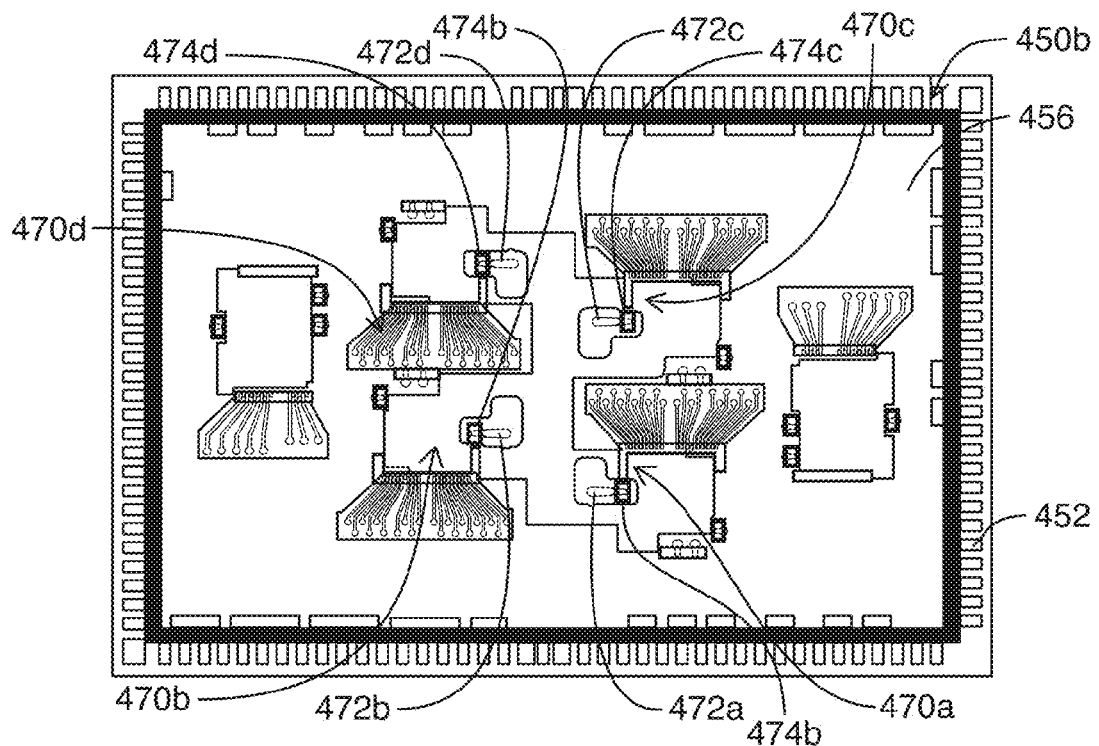
Figure 12C:
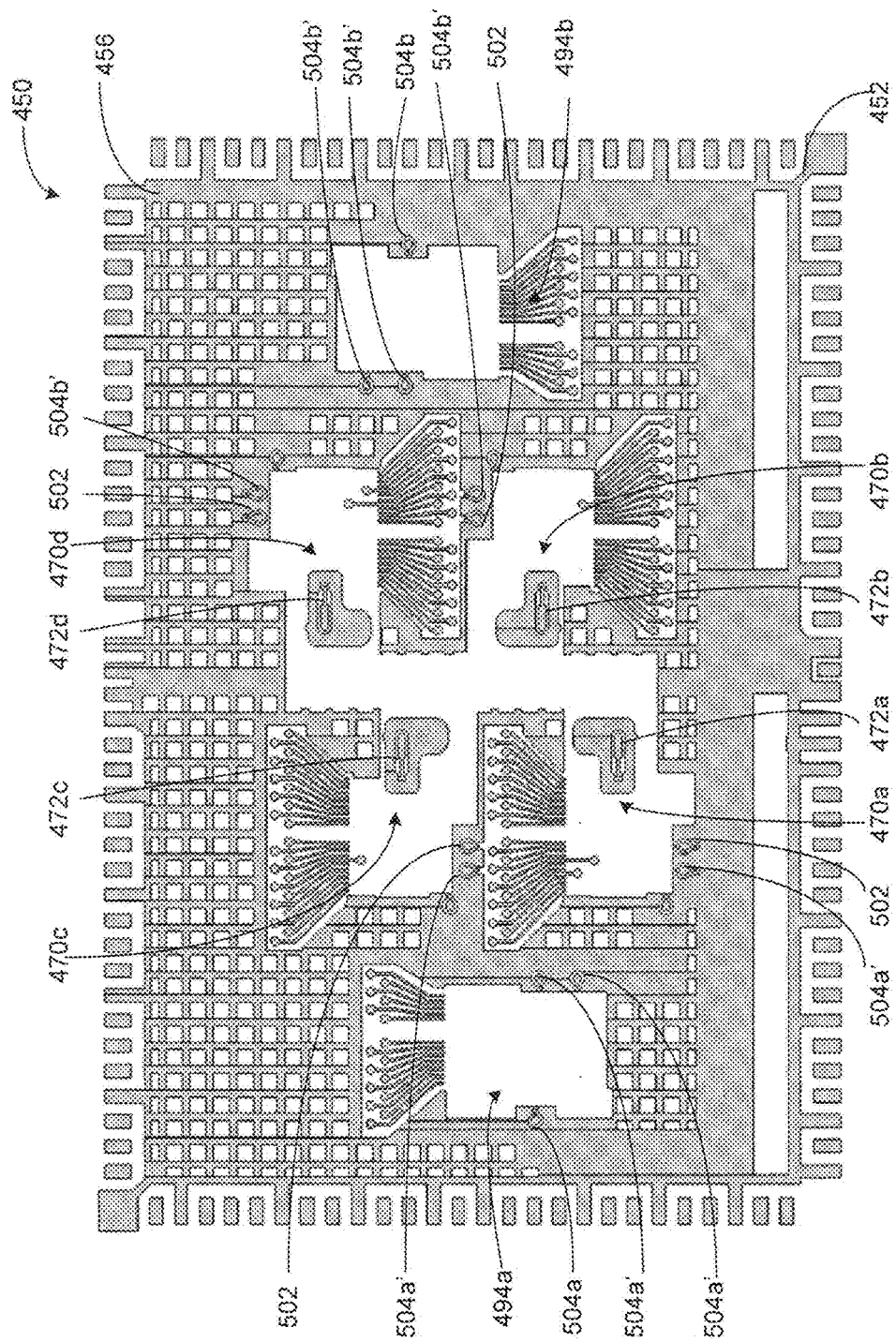
FIG. 12c shows a layout for the substrate shown in FIG. 12b.

Referring now to FIG. 10b, the rear face 356 is formed for receiving a transmitting module 180. FIGS. 12a to 12c show an example antenna module 450 for receiving a receiving module 280, and will be described.

Figure 10C:
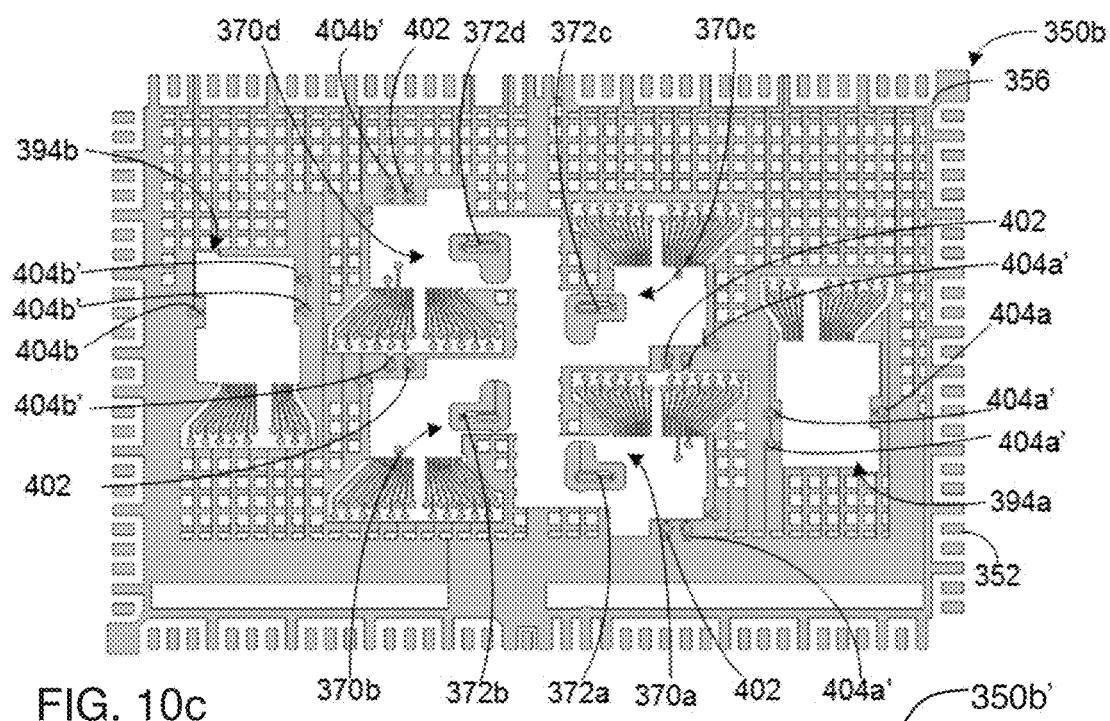
FIG. 10c shows a layout for the substrate shown in FIG. 10b.
Figure 10D:
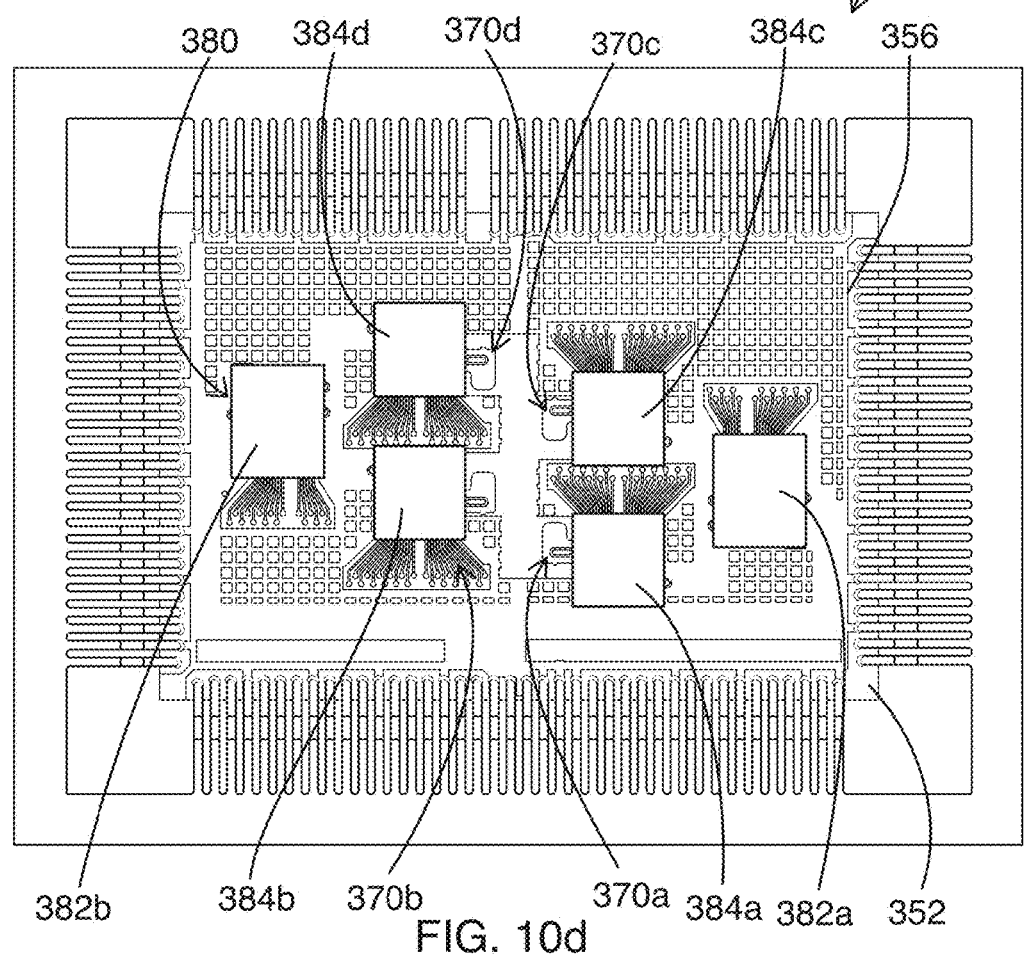
FIG. 10d shows the substrate of FIGS. 10a to 10c mounted with an example transmitting module, in accordance with an example embodiment.

FIG. 10c shows a layout for the rear side 350b shown in FIG. 10b, and FIG. 10d shows, at 350b', the substrate 352 mounted with an example transmitting module 380.

The substrate 352 is formed to receive a transmitting module 380 formed of a first stage multiplier, such as 140 shown in FIG. 6, and a transmitter circuit having a second stage multiplier, such as 182' shown in FIG. 5. The transmitting module 380 includes two first stage frequency multiplier 382a and 382b. Each of the first stage frequency multipliers 382a and 382b drives two transmitter circuits, namely 384a and 384c, and 384b and 384d, respectively.

Shown generally at 394a and 394b on FIG. 10c are areas on the substrate 352 for receiving the first stage frequency multipliers 382a and 382b, respectively. RF signal launchers 370a to 370d are formed on the rear face 356 of the substrate 352. A RF signal launcher 370 is provided for each column 366 of active antenna elements 364. Each RF signal launcher 370a to 370d includes a corresponding stub 372a to 372d.

Figure 11B:
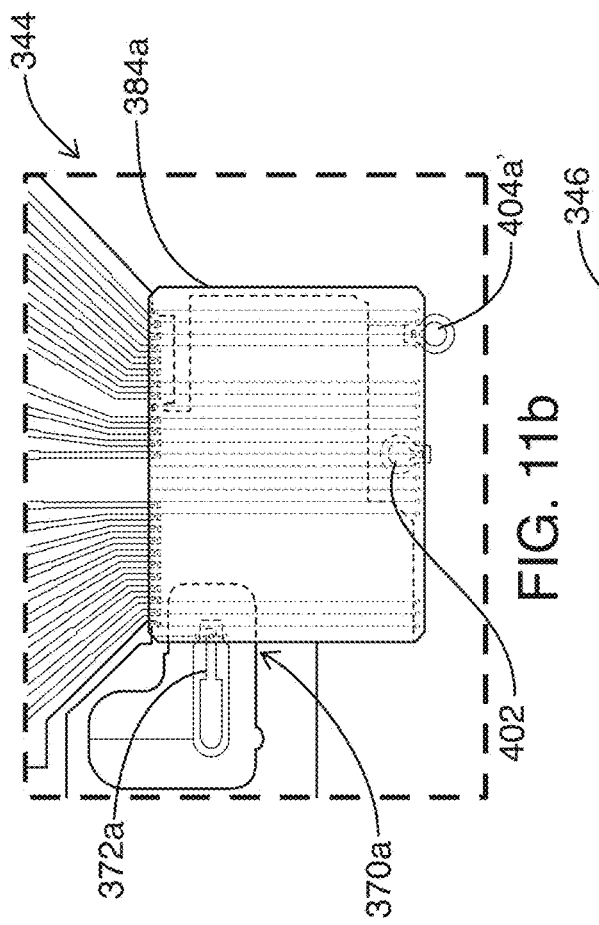
Figure 11C:
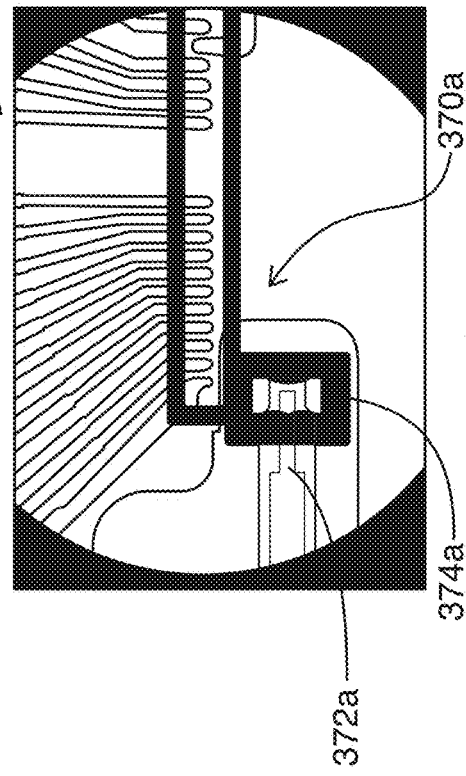
FIG. 11c shows a partial view of the schematic shown in FIG. 11b coupled with an example spacer.
Figure 11A:
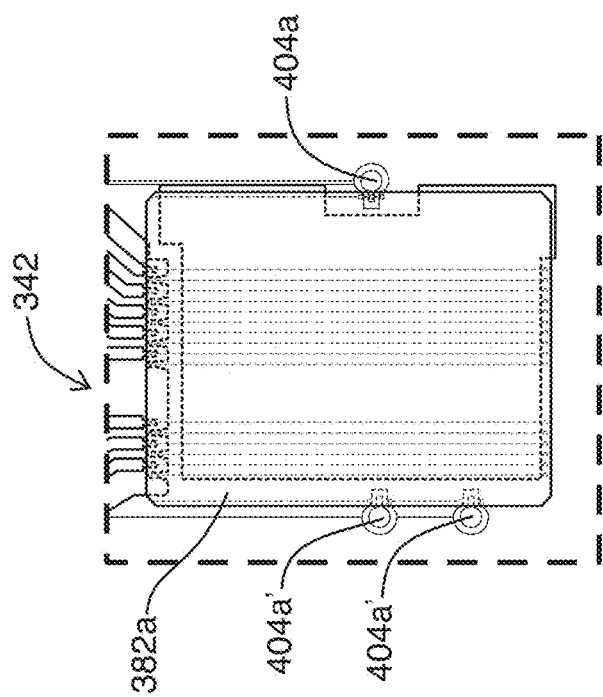
FIG. 11a is a partial view of the layout of FIG. 10c mounted with a component of an example transmitting module using a lead frame.

FIG. 11a is a partial view 342 of the layout of FIG. 10b with the first stage frequency multiplier 382a mounted. A carrier signal port 404a is provided on the substrate 352 for receiving the initial carrier signal 114. The first stage frequency multiplier 382a receives the initial carrier signal 114 from the carrier signal port 404a. The first stage frequency multiplier 382a converts the initial carrier signal 114 to a second version of the initial carrier signal 114, and transmits the second version of the initial carrier signal to each of the carrier signal ports 404a'. As shown on FIG. 10c, the area shown generally at 394b also includes a carrier signal port 404b for receiving the initial carrier signal 114 for the first stage frequency multiplier 382b to be mounted, and a pair of carrier signal ports 404b' for receiving the second version of the initial carrier signal 114 from the first stage frequency multiplier 382b.

FIG. 11b is a partial view 344 of the layout of FIG. 10b with the transmitter circuit 384a mounted. The carrier signal port 404a' receives the second version of the initial carrier signal from the first stage frequency multiplier 382a. The transmitter circuit 384a also receives the baseband data signal 112 from a data signal port 402. The transmitter circuit 384a converts the second version of the initial carrier signal to a third version of the initial carrier signal, and modulates the baseband data signal 112 with the third version of the initial carrier signal to generate the RF data signal 116. The transmitter circuit 384a then transmits the RF data signal 116 to the RF signal launcher 370a via the stub 372a.

From FIGS. 10c and 10d, it can be seen that a data signal port 402 and carrier signal port 404a' are also provided for coupling the transmitter circuit 384c. Similarly, a data signal port 402 and carrier signal port 404b' are provided for each of the transmitter circuits 384b and 384d, respectively.

As shown in FIG. 10d, the transmitter circuit 384a is aligned with the RF signal launcher 370a, the transmitter circuit 384b is aligned with the RF signal launcher 370b, the transmitter circuit 384c is aligned with the RF signal launcher 370c, and the transmitter circuit 384d is aligned with the RF signal launcher 370d. The RF signal launcher 370a transmits the RF data signal 116 to the column 366a, the RF signal launcher 370b transmits the RF data signal 116 to the column 366b, the RF signal launcher 370c transmits the RF data signal 116 to the column 366c, and the RF signal launcher 370d transmits the RF data signal 116 to the column 366d.

FIG. 11c shows a partial view 346 of the layout of FIG. 10b with an example spacer 374 provided thereon.

A spacer 374 can be positioned at each RF signal launcher 370, such as RF signal launcher 370a, to control the spacing between the rear face 356 and the transmitter circuit 384a to be mounted thereon. By optimizing the spacing between the rear face 356 and the transmitter circuit 384a, electrical and dielectric losses can be minimized to prevent dielectric and ohmic coupling and losses. The dimension of the spacing can vary with the dimensions of the RF signal launcher 370a and/or the transmitter circuit 384a mounted thereon. The spacing can be designed to have a range of approximately 25 to 100 μm, for example.

The spacer 374 can be provided as a solder stop formed of a cured solder material. The spacer 374 can act as a boundary for the pins of the RF signal launcher 370, as shown in FIG. 11c, that connect with the transmitter circuit 384a. When the transmitter circuit 384a is mounted to the substrate 352, the solder can expand and possibly run. Without the spacer 374, the solder can run beyond the pins on the substrate 352 and the resulting connection between the transmitter circuit 384a and the substrate 352 can be uneven and/or unstable. With the spacer 374, the solder is prevented from running beyond a certain area.

The spacer 374 also controls the amount of solder between the transmitter circuit 384a and the substrate 352 so that the distance between the transmitter circuit 384a and the substrate 352 can be substantially uniform.

The solder used to mount the transmitter circuit 384a to the substrate 352 can be formed of C4 solder balls. The C4 solder balls can be composed of SAC305, which is a lead-free alloy that contains 96.5% tin, 3% silver, and 0.5% copper.

FIG. 12a is a top view 450a of a substrate 452 for an antenna module 450, and FIG. 12b is a rear view 450b of the substrate 452. The substrate 452 has a front face 454 and a rear face 456.

Similar to the antenna module 350 shown in FIGS. 10a and 10b, the front face 454 has a phased array 460 of antenna elements 464 formed in columns 466, namely columns 466a to 466d. Each column 466 is terminated by a pair of passive elements 462. Each neighboring column 466 is separated from each other by a column distance 468. The column distance 468 for the example substrate 452 shown in FIG. 12a is substantially equidistant. In some other embodiments, the column distance 468 may vary.

FIG. 12c shows a layout 450 for a rear side of another substrate 452 for the antenna module 350 of FIG. 10a. The substrate 452 is formed to receive a receiving module 280.

The receiving module 280 is formed of a first stage frequency multiplier, such as 140 shown in FIG. 6, and a receiver circuit having a second stage frequency multiplier, such as 282' shown in FIG. 8. The receiving module 280 includes a first and second frequency multiplier. An example first frequency multiplier is shown at 482a in FIG. 13a. Each of the first stage frequency multipliers drives two receiver circuits. An example receiver circuit driven by the first stage frequency multiplier 482a is shown at 484a in FIG. 13b.

Shown generally at 494a and 494b on FIG. 12c are areas on the substrate 452 for receiving the first stage frequency multipliers, such as 482a, respectively. RF signal launchers 470a to 470d are formed on the rear face 456. A RF signal launcher 470 is provided for each column 366 of active antenna elements 364. Each RF signal launcher 470a to 470d includes a corresponding stub 472a to 472d.

FIG. 13a is a partial view 442 of the layout shown in FIG. 12c with the first stage frequency multiplier 482a mounted.

A carrier signal port 504a is provided on the substrate 452 for receiving the initial carrier signal 214. The first stage frequency multiplier 482a receives the initial carrier signal 214 from the carrier signal port 504a. The first stage frequency multiplier 482a converts the initial carrier signal 214 to a second version of the initial carrier signal 214, and transmits the second version of the initial carrier signal 214 to each of the carrier signal ports 504a'. As shown on FIG. 12c, the area shown generally at 494b also includes a carrier signal port 504b for receiving the initial carrier signal 214 for the first stage frequency multiplier 482b to be mounted, and a pair of carrier signal ports 504b' for receiving the second version of the initial carrier signal 214 from the first stage frequency multiplier 482b.

FIG. 13b is a partial view 444 of the layout shown in FIG. 12c with the receiver circuit 484a mounted. The carrier signal port 504a' receives the second version of the initial carrier signal 214 from the first stage frequency multiplier 482a, and converts the second version of the initial carrier signal 214 to a third version of the initial carrier signal 214. The receiver circuit 484a receives the RF data signal 216 from the RF signal launcher 470a via the stub 472a. Using the third version of the initial carrier signal 214, the receiver circuit 484a retrieves the baseband data signal 212 from the RF data signal 216, and transmits the baseband data signal 212 via the data signal port 502.

As shown on FIG. 12c, a data signal port 402 and carrier signal port 504a' are also provided for coupling a receiver circuit 484c. Similarly, a data signal port 502 and carrier signal port 504b' are provided for each of the receiver circuits 484b and 484d, respectively.

Figure 14:
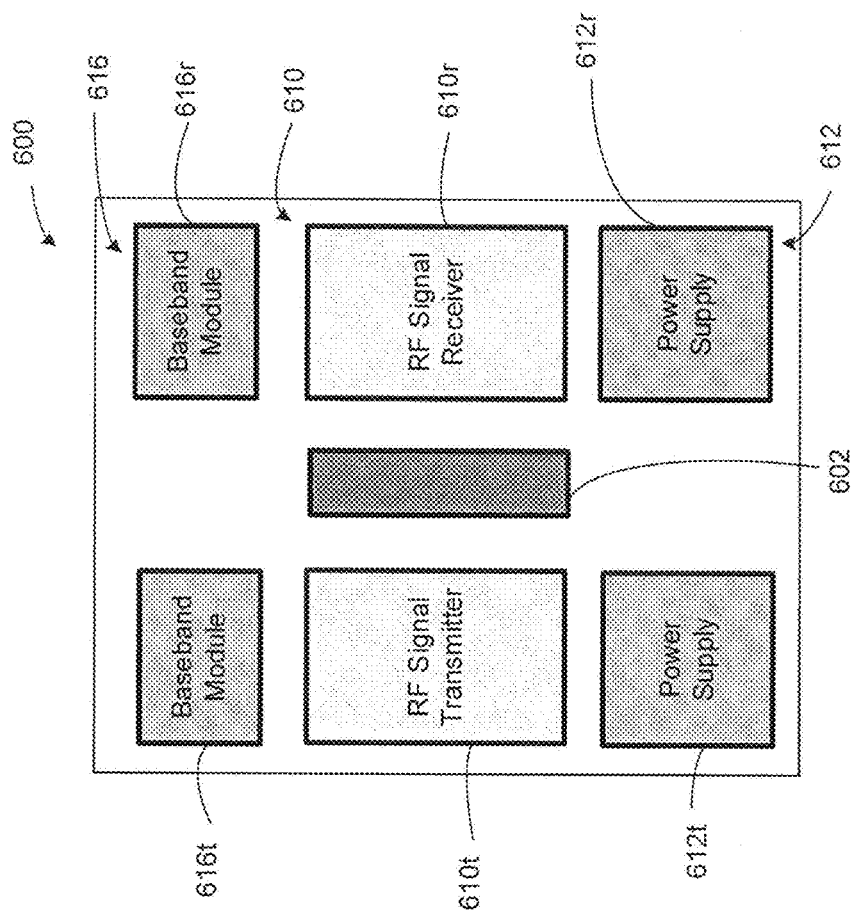
FIG. 14 is a block diagram of a transceiver in accordance with an example embodiment.

FIG. 14 is a block diagram of a transceiver 600. The transceiver 600 includes antenna modules 610, namely a RF signal transmitter 610t and a RF signal receiver 610r, as described herein. The RF signal transmitter 610t and the RF signal receiver 610r are separated by an isolator 602.

The isolator 602 acts to choke surface transmission between the RF signal transmitter 610t and RF signal receiver 610r. The isolator 602 is designed for the specific RF signal transmitter 610t and RF signal receiver 610r selected for the transceiver 600. Typically, the isolator 602 can provide a range of isolation, such as approximately 40 db to 80 db.

As shown in FIG. 14, the transceiver 600 also includes a baseband module 616 and a power supply 612 for each of the RF signal transmitter 610t and RF signal receiver 610r. The baseband module 616 is divided into a transmitter baseband module 616t and a receiver baseband module 616r, and the power supply 612 is divided into a transmitter power supply 612t and a receiver power supply 612r. However, in some embodiments, the transmitter baseband module 616t and the receiver baseband module 616r can be provided as one component or more than two components. Similarly, in some embodiments, the transmitter power supply 612t and the receiver power supply 612r can be provided as one component or more than two separate components.

Figure 15A:
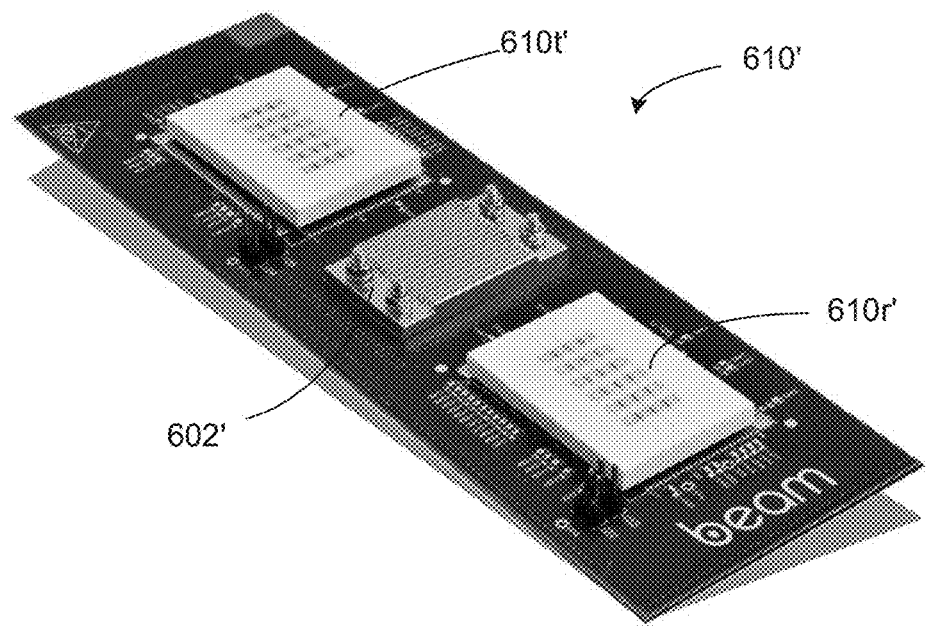
FIG. 15a is a perspective view of an example transceiver in accordance with an example embodiment.
Figure 15B:
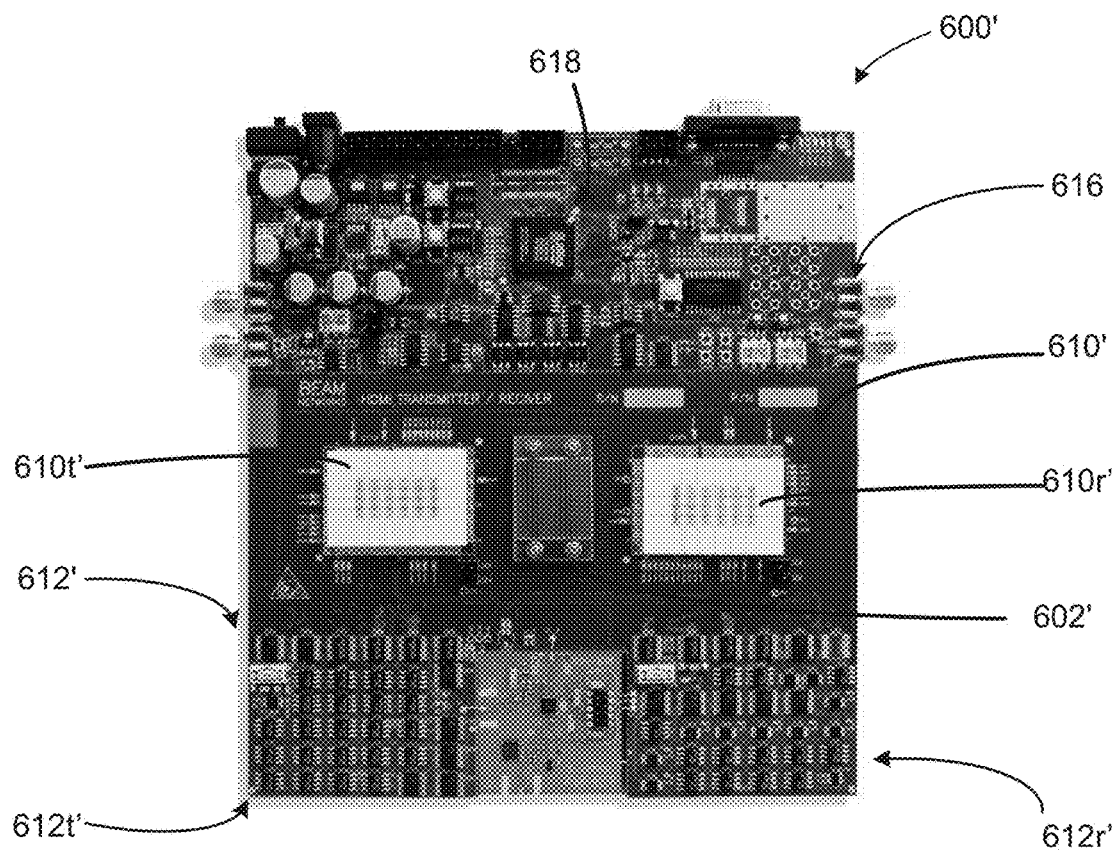
FIG. 15*b* is a top view of a printed circuit board mounted with the transceiver of FIG. 15*a*.

FIG. 15a is a perspective view of an antenna module 610' and FIG. 15b is a top view of a transceiver 600' mounted with the antenna module 610' shown in FIG. 15b.

The antenna module 610' includes a RF signal transmitter 610t', a RF signal receiver 610r', and an isolator 602' separating the RF signal transmitter 610t' and the RF signal receiver 610r'. In the example antenna module 610' shown in FIG. 15a, the isolator 602' is implemented with a corrugated wall design. It will be understood that other designs for the isolator 602' may be used.

The transceiver 600' includes the antenna module 610' of FIG. 15a, a power supply 612' with a transmitter power supply 612t' and a receiver power supply 612r', a baseband module 616, and a beam steering module 618. The baseband module 616 in this example includes SMA™ (SubMiniature version A) coax connectors for receiving baseband signal injection and transmitting baseband signal extraction. The beam steering module 618 can be provided on a field-programmable gate array (FPGA™).

Figure 16A:
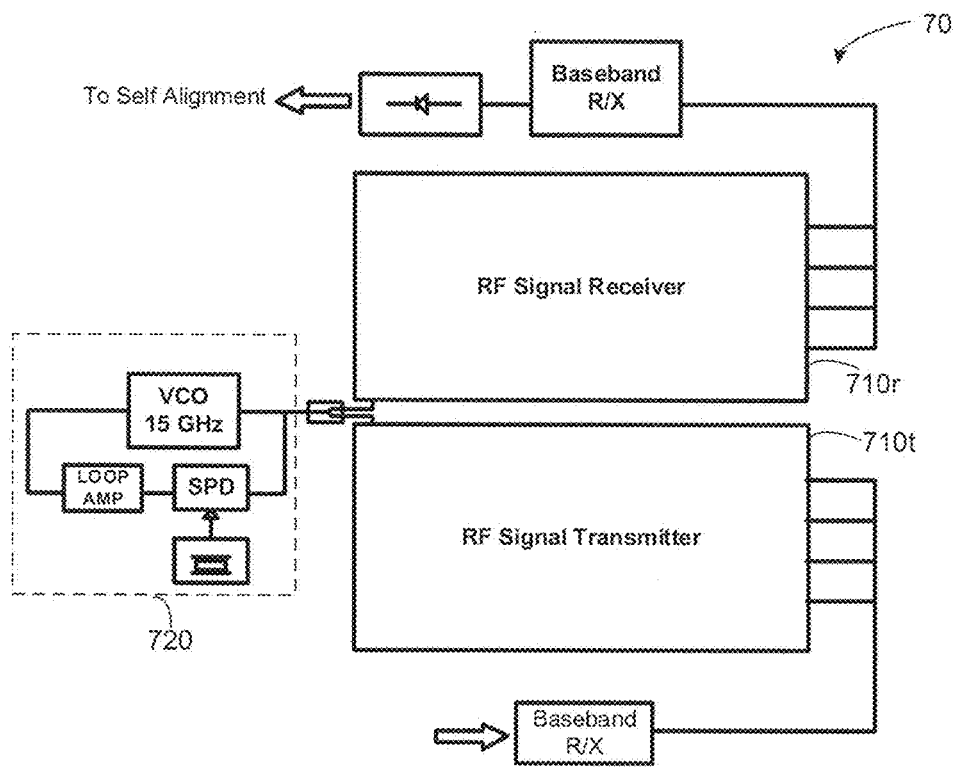
FIG. 16*a* is a schematic of a circuit for an example master transceiver in accordance with an example embodiment.
Figure 16B:
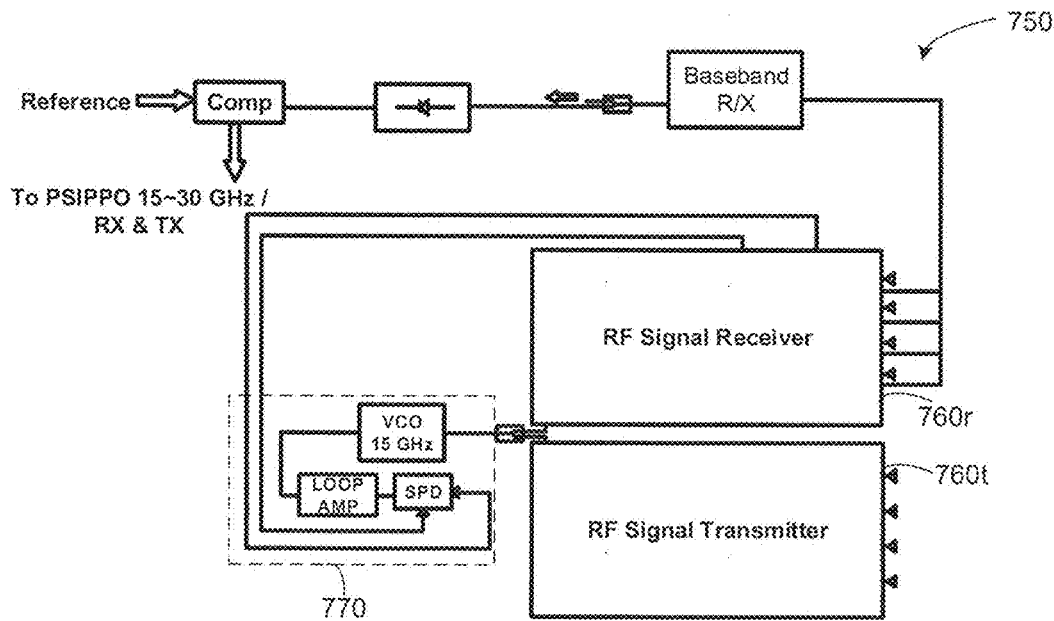
FIG. 16*b* is a schematic of a circuit for an example slave transceiver in accordance with an example embodiment.

A bi-directional data communication system can be formed with a master transceiver 700 shown in FIG. 16a and a slave transceiver 750 shown in FIG. 16b. The slave transceiver 750 can be configured to receive incoming RF data signals from the master transceiver 700 and to transmit outgoing RF data signals to the master transceiver 700.

The master transceiver 700 includes a RF signal transmitter 710t and a RF signal receiver 710r. The RF signal transmitter 710t and the RF signal receiver 710r can be implemented with any of the antenna modules 10 described herein. A phase-locked loop 720 can be provided at the master transceiver 700 for supplying a locked initial carrier signal. The example phase-locked loop 720 includes a sampling phase detector (SPD), a loop amplifier, a VCO and a crystal oscillator.

The slave transceiver 750 also includes a RF signal transmitter 760t and a RF signal receiver 760r. The RF signal transmitter 760*t* and the RF signal receiver 760*r* can be implemented with any of the antenna modules 10 described herein. Similar to the master transceiver 700, the slave transceiver 750 can also include a phase-locked loop 770. The example phase-locked loop 770 includes a sampling phase detector (SPD), a loop amplifier, and a VCO.

In some embodiments, the master transceiver 700 can serve one or more slave transceivers 750 at one time.

Figure 17:
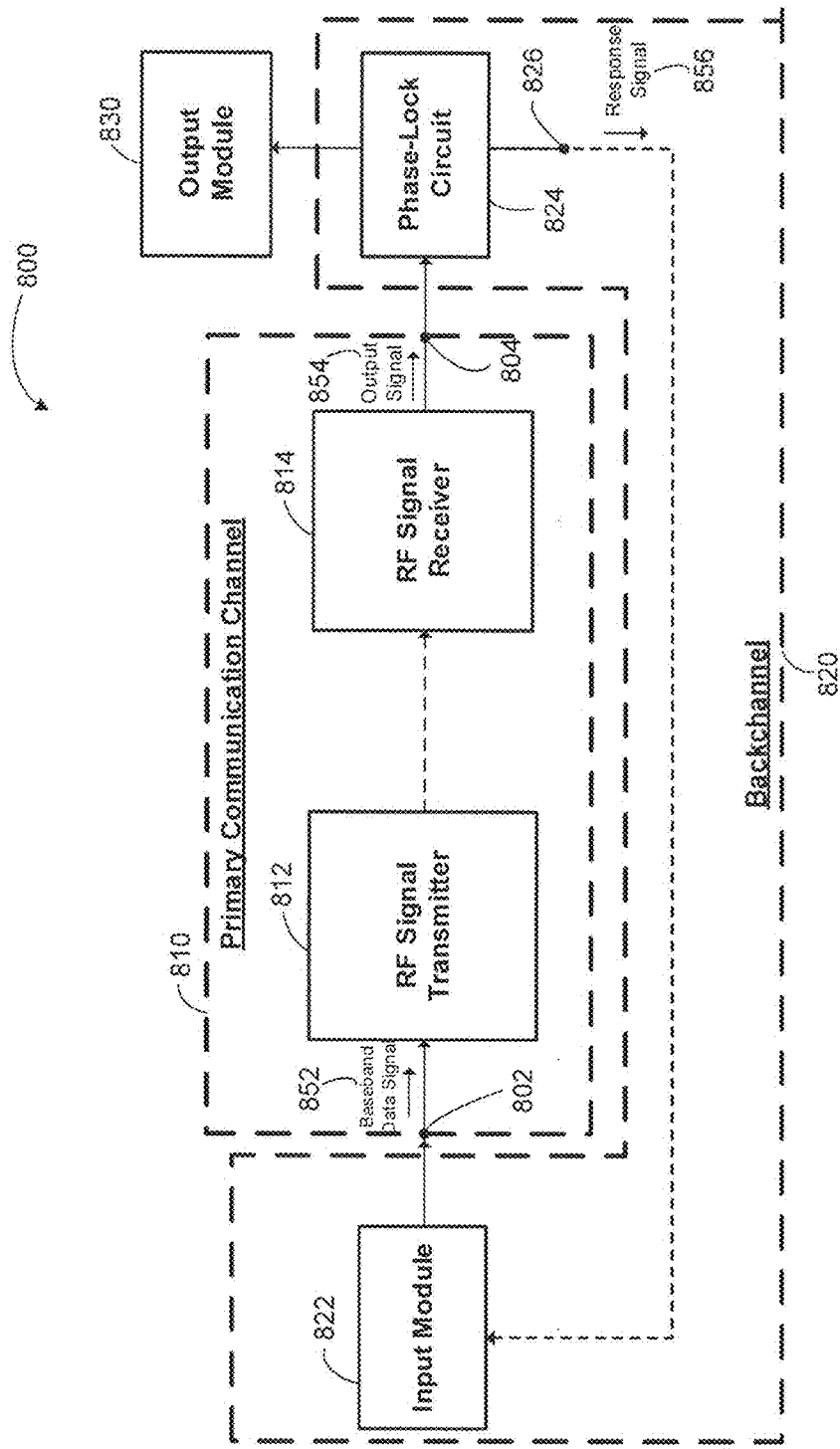
FIG. 17 is a block diagram of an example data transmission system.

The data communication systems described herein can be implemented with a backchannel. FIG. 17 is a block diagram of an example data transmission system 800 with a backchannel 820.

A primary communication channel 810 can be formed between a RF signal transmitter 812 and a RF signal receiver 814. The RF signal transmitter 812 and the RF signal receiver 814 can be any of the antenna modules 10 described herein. In some embodiments, the RF signal receiver 814 can include one or more RF signal receivers 814. In some embodiments, the RF signal receiver 814 can be provided using implementations different from those described herein.

The RF signal transmitter 812 can receive the baseband data signal 852 from an external input module 822 at an input data port 802. The RF signal receiver 814 can transmit an output signal 854, which can include the retrieved baseband data signal 852' and other data signals, to an external phase-lock circuit 824 via an output port 804. The external input module 822 and the phase-lock circuit 824 can form the backchannel 820.

The phase-lock circuit 824 can analyze the output signal 854 to determine a quality of the transmission of the baseband data signal 852', and to generate a response signal 856 at an error response terminal 826. The response signal 856 is transmitted to the input module 822. The response signal 856 represents a quality of the data transmission between the RF signal transmitter 812 and the RF signal receiver 814. For example, the response signal 856 can include an acknowledgement signal ("ACK") indicating that the output signal 854 was received, or a negative-acknowledgement signal ("NACK") indicating an error occurred during the data transmission.

The backchannel 820 can be implemented with a network that has a lower bandwidth than the primary communication channel 810. For example, the backchannel 820 can be implemented using a wireless communications technology (e.g., WLAN, LAN, ethernet or other core network access location etc.) or a mobile communications technology (e.g., 3G, 4G, LTE, etc.).

The substrate for the antenna modules 10 described herein are fabricated with a series of layers that form the antenna elements and the interconnect interface for receiving the RF modules. The alignment between each of the layers is, therefore, critical to the operation of the antenna module 10. Registration between each of the layers can be facilitated with, at least, alignment pins, which will be described with reference to FIGS. 18*a* to 18*c*.

FIG. 18*a* is a top view 900*a* of a substrate manufacturing jig 952 for an antenna module 900. FIG. 18*b* is a side view 900*b* of the substrate manufacturing jig 952 and FIG. 18*c* is a perspective view 900*c* of the substrate manufacturing jig 952.

In the example substrate manufacturing jig 952, two sets of alignment pins are provided. A first set 920 of alignment pins, namely 920*a* to 920*d*, are positioned closer to a phased array 960 being formed on a front face 954 than a second set 910 of alignment pins, namely 910*a* to 910*d*, which are located nearly a perimeter of the substrate manufacturing jig 952.

An orientation pin 930 is also provided. The orientation pin 930 may be provided as an orientation marker.

The sets 910, 920 of alignment pins guide the formation of the substrate 952 so that each layer can be positioned with respect to the previous layer. The orientation pin 930 aides with the orientation of each layer with respect to the previous layer. It will be understood that the antenna modules may be formed with only one of the sets 910, 920 of alignment pins.

It will be appreciated that numerous specific details are set forth in order to provide a thorough understanding of the example embodiments described herein. However, it will be understood by those of ordinary skill in the art that the embodiments described herein may be practiced without these specific details. In other instances, well-known methods, procedures and components have not been described in detail so as not to obscure the embodiments described herein. Furthermore, this description and the drawings are not to be considered as limiting the scope of the embodiments described herein in any way, but rather as merely describing the implementation of the various embodiments described herein.

It should be noted that terms of degree such as "substantially", "about" and "approximately" when used herein mean a reasonable amount of deviation of the modified term such that the end result is not significantly changed. These terms of degree should be construed as including a deviation of the modified term if this deviation would not negate the meaning of the term it modifies.

In addition, as used herein, the wording "and/or" is intended to represent an inclusive-or. That is, "X and/or Y" is intended to mean X or Y or both, for example. As a further example, "X, Y, and/or Z" is intended to mean X or Y or Z or any combination thereof.

It should be noted that the term "coupled" used herein indicates that two elements can be directly coupled to one another or coupled to one another through one or more intermediate elements.

The embodiments of the systems and methods described herein may be implemented in hardware or software, or a combination of both. These embodiments may be implemented in computer programs executing on programmable computers, each computer including at least one processor, a data storage system (including volatile memory or non-volatile memory or other data storage elements or a combination thereof), and at least one communication interface.

Various embodiments have been described herein by way of example only. Various modification and variations may be made to these example embodiments without departing from the spirit and scope of the invention, which is limited only by the appended claims.

We claim:

1. A radio frequency signal transmitter comprising:
   a data signal port for receiving a baseband data signal;
   a carrier signal port for receiving an initial carrier signal; and
   an antenna module coupled to each of the data signal port and the carrier signal port, the antenna module comprising:
   a substrate having:
   a front face having a phased array of active antenna elements, the phased array of active antenna elements including at least two columns of the active antenna elements; and a rear face opposite the front face, the rear face having, for each column of active antenna elements, a radio frequency (RF) signal launcher to receive a RF data signal for the column of active antenna elements; and a transmitting module mounted to the rear face of the substrate, the transmitting module comprising, for each column of active antenna elements:
a combiner to combine the baseband data signal and a version of the initial carrier signal to form the RF data signal; and
a RF signal port to transmit the RF data signal to the RF signal launcher, wherein: the transmitting module comprises: a frequency multiplier to receive the initial carrier signal from the carrier signal port and to convert the initial carrier signal to a second version of the initial carrier signal, wherein a frequency of the second version of the initial carrier signal is equal to a frequency of the initial carrier signal multiplied by a first multiplication factor; and the combiner forms the RF data signal using the baseband data signal and the second version of the initial carrier signal.

2. The device of claim 1, wherein a number of active antenna elements in each column is a power of two.

3. The device of claim 1, wherein each column comprises a pair of passive antenna elements positioned at opposite ends of the column.

4. The device of claim 1, wherein each column is positioned substantially equidistant from a neighboring column.

5. The device of claim 1, wherein each column comprises at least four active antenna elements.

6. The device of claim 1, wherein:
the frequency multiplier converts the second version of the initial carrier signal to a third version of the initial carrier signal, wherein a frequency of the third version of the initial carrier signal is equal to the frequency of the initial carrier signal multiplied by a second multiplication factor; and
the combiner forms the RF data signal using the baseband data signal and the third version of the initial carrier signal.

7. The device of claim 6, wherein: the frequency multiplier comprises a first multiplier stage and a second multiplier stage; and
for every two columns of the at least two columns,
the first multiplier stage comprises a distributed local oscillator for generating the second version of the initial carrier signal; and
for each column of the two columns, the second multiplier stage is coupled to the distributed local oscillator to receive the second version of the initial carrier signal and to generate the third version of the initial carrier signal.

8. The device of claim 1, wherein each RF signal launcher comprises a stub for directing the RF data signal to the column of active antenna elements.

9. The device of claim 1 further comprises an enclosure layer mounted to the front face and the enclosure layer comprises a radome.

10. The device of claim 1 further comprises an enclosure layer mounted to the front face and the enclosure layer comprises a lens positioned to enclose the phased array of antenna elements.

11. The device of claim 1, wherein the rear face comprises at least one spacer to maintain a substantially uniform distance between the substrate and the transmitting module.

12. The device of claim 11, wherein the spacer is positioned at each RF signal launcher.

13. The device of claims 11, wherein the spacer comprises a solder stop.

14. A radio frequency signal receiver comprising:
a data signal port for transmitting a baseband data signal;
a carrier signal port for receiving an initial carrier signal; and
an antenna module coupled to each of the data signal port and the carrier signal port, the antenna module comprising:
a substrate having:
a front face having a phased array of active antenna elements, the phased array of active antenna elements including at least two columns of the active antenna elements; and
a rear face opposite the front face, the rear face having, for each column of active antenna elements, a radio frequency (RF) signal launcher for receiving a RF data signal from the column of active antenna elements; and
a receiving module mounted to the rear face of the substrate, the receiving module comprising, for each column of active antenna elements:
a RF signal port coupled to the RF signal launcher to receive the RF data signal from the column of active antenna elements; and
a detector to retrieve the baseband data signal from the RF data signal using a version of the initial carrier signal, wherein the receiving module comprises: a frequency multiplier to receive the initial carrier signal from the carrier signal port and to convert the initial carrier signal to a second version of the initial carrier signal, wherein a frequency of the second version of the initial carrier signal is equal to a frequency of the initial carrier signal multiplied by a first multiplication factor; and the detector retrieves the baseband data signal using the second version of the initial carrier signal.

15. The device of claim 14, wherein a number of active antenna elements in each column is a power of two.

16. The device of claim 14, wherein each column comprises a pair of passive antenna elements positioned at opposed ends of the column.

17. The device of claim 14, wherein:
the frequency multiplier converts the second version of the initial carrier signal to a third version of the initial carrier signal, wherein a frequency of the third version of the initial carrier signal is equal to the frequency of the initial carrier signal multiplied by a second multiplication factor; and
the detector retrieves the baseband data signal using the third version of the initial carrier signal.

18. The device of claim 17, wherein: the frequency multiplier comprises a first multiplier stage and a second multiplier stage; and
for every two columns of the at least two columns,
the first multiplier stage comprises a distributed local oscillator for generating the second version of the initial carrier signal; and
for each column of the two columns, the second multiplier stage is coupled to the distributed local oscillator to receive the second version of the initial carrier signal and to generate the third version of the initial carrier signal.

19. The device of claim 14, wherein each RF signal launcher comprises a stub for directing the RF data signal to the RF signal port from the column of active antenna elements.

20. The device of claim 14, further comprises an enclosure layer mounted to the front face and the enclosure layer comprises a radome.

21. The device of claim 14, further comprises an enclosure layer mounted to the front face and the enclosure layer comprises a lens positioned to enclose the phased array of antenna elements.

22. The device of claim 14, wherein the rear face comprises at least one spacer to maintain a substantially uniform distance between the substrate and the receiving module.

23. A transceiver comprising:
   a radio frequency (RF) signal transmitter comprising:
      a transmitter data signal port for receiving an outgoing baseband data signal;
      a transmitter carrier signal port for receiving an initial transmitter carrier signal;
      a transmitter substrate having:
         a front face having a phased array of active antenna elements, the phased array of active antenna elements including at least two columns of the active antenna elements; and
         a rear face opposite the front face, the rear face having, for each column of active antenna elements, a RF signal launcher to receive a RF data signal for the column of active antenna elements; and
      a transmitting module mounted to the rear face of the substrate, the transmitting module comprising, for each column of active antenna elements:
         a combiner to combine the outgoing baseband data signal and a version of the initial transmitter carrier signal to form the RF data signal; and
         a RF signal port to transmit the RF data signal to the RF signal launcher, wherein: the transmitting module comprises: a frequency multiplier to receive the initial carrier signal from the carrier signal port and to convert the initial carrier signal to a second version of the initial carrier signal, wherein a frequency of the second version of the initial carrier signal is equal to a frequency of the initial carrier signal multiplied by a first multiplication factor; and the combiner forms the RF data signal using the baseband data signal and the second version of the initial carrier signal;
   a RF signal receiver comprising:
      a receiver data signal port for receiving an incoming RF data signal;
      a receiver substrate having:
   an isolator separating the RF signal transmitter and the RF signal receiver.

* * * * *